US012429746B2

United States Patent
Yao

(10) Patent No.: US 12,429,746 B2
(45) Date of Patent: Sep. 30, 2025

(54) OPTICAL BEAM SCANNING BASED ON WAVEGUIDE SWITCHING AND POSITION-TO-ANGLE CONVERSION OF A LENS AND APPLICATIONS

(71) Applicant: Xiaotian Steve Yao, Las Vegas, NV (US)

(72) Inventor: Xiaotian Steve Yao, Las Vegas, NV (US)

(*) Notice: Subject to any disclaimer, the term of this patent is extended or adjusted under 35 U.S.C. 154(b) by 964 days.

(21) Appl. No.: 17/506,654

(22) Filed: Oct. 20, 2021

(65) Prior Publication Data

US 2022/0121080 A1    Apr. 21, 2022

Related U.S. Application Data

(60) Provisional application No. 63/094,338, filed on Oct. 20, 2020.

(51) Int. Cl.
| | | |
|---|---|---|
| *G02F 1/31* | (2006.01) | |
| *G01S 7/481* | (2006.01) | |
| *G02B 6/42* | (2006.01) | |
| *H01S 5/50* | (2006.01) | |

(52) U.S. Cl.
CPC .............. *G02F 1/31* (2013.01); *G01S 7/4817* (2013.01); *G01S 7/4818* (2013.01); *G02B 6/4206* (2013.01); *H01S 5/50* (2013.01)

(58) Field of Classification Search
None
See application file for complete search history.

(56) References Cited

U.S. PATENT DOCUMENTS

| | | |
|---|---|---|
| 5,359,409 A | 10/1994 | Wildnauer et al. |
| 5,723,856 A | 3/1998 | Yao et al. |
| 5,777,778 A | 7/1998 | Yao |
| 5,917,179 A | 6/1999 | Yao |
| 5,929,430 A | 7/1999 | Yao et al. |
| 6,387,197 B1 | 5/2002 | Bewlay et al. |
| 6,417,957 B1 | 7/2002 | Yao |
| 6,476,959 B2 | 11/2002 | Yao |
| 6,487,336 B1 | 11/2002 | Yao |
| 6,567,436 B1 | 5/2003 | Yao et al. |
| 6,580,532 B1 | 6/2003 | Yao et al. |
| 6,778,739 B1 | 8/2004 | Jerphagnon et al. |
| 6,795,481 B2 | 9/2004 | Maleki et al. |
| 6,873,631 B2 | 3/2005 | Yao et al. |

(Continued)

FOREIGN PATENT DOCUMENTS

WO    2019161388 A1    8/2019

OTHER PUBLICATIONS

LiDAR drives forwards, Nature Photon 12, 441 (2018).

(Continued)

*Primary Examiner* — Eric L Bolda
(74) *Attorney, Agent, or Firm* — Perkins Coie LLP

(57) ABSTRACT

Techniques and devices for beam scanning using optical waveguides and an optical lens without moving parts for various applications including scanning light from a source to multiple waveguides or fibers with their terminals being in a 1D or 2D array for various applications including, e.g., ranging applications such as light detection and ranging (LiDAR), time of flight (ToF), coherent detection with a frequency modulated continuous wave (FMCW) laser, or microwave photonic FMCW source.

12 Claims, 19 Drawing Sheets

Illustration of an example of 4th embodiment of a ToF Lidar based on waveguide-switching on a PIC chip and position-to-angle conversion of a lens.

(56) References Cited

U.S. PATENT DOCUMENTS

| | | | |
|---|---|---|---|
| 7,061,657 | B1 | 6/2006 | Fishman et al. |
| 9,689,968 | B2 | 6/2017 | Zou et al. |
| 9,823,118 | B2 | 11/2017 | Doylend et al. |
| 10,838,047 | B2* | 11/2020 | Chong .................... G01S 17/32 |
| 2003/0160148 | A1 | 8/2003 | Yao et al. |
| 2007/0233396 | A1 | 10/2007 | Tearney et al. |
| 2008/0074640 | A1 | 3/2008 | Walsh et al. |
| 2012/0206712 | A1 | 8/2012 | Chang et al. |
| 2015/0345950 | A1 | 12/2015 | Yao |
| 2017/0155225 | A1 | 6/2017 | Villeneuve et al. |
| 2017/0184450 | A1 | 6/2017 | Doylend et al. |
| 2017/0307648 | A1 | 10/2017 | Kotake et al. |
| 2018/0224547 | A1 | 8/2018 | Crouch et al. |
| 2018/0306925 | A1 | 10/2018 | Hosseini et al. |
| 2019/0204419 | A1 | 7/2019 | Baba et al. |
| 2019/0219779 | A1 | 7/2019 | Beresnev et al. |
| 2019/0250253 | A1 | 8/2019 | Hung et al. |
| 2019/0257927 | A1 | 8/2019 | Yao |
| 2019/0353977 | A1* | 11/2019 | Hung .................... G01S 17/931 |
| 2020/0241119 | A1* | 7/2020 | Asghari ................ G01S 7/4818 |
| 2020/0400822 | A1* | 12/2020 | Ando ...................... G01S 17/95 |
| 2022/0011643 | A1* | 1/2022 | Shrestha ............... G01S 7/4816 |
| 2022/0050187 | A1 | 2/2022 | Yao |
| 2022/0229162 | A1* | 7/2022 | Tsadka .................. G01S 7/4818 |
| 2022/0365214 | A1* | 11/2022 | Sandborn ................ G01S 17/42 |
| 2023/0152525 | A1* | 5/2023 | Hosseini ............... G02F 1/0147 398/45 |
| 2023/0168560 | A1* | 6/2023 | McManamon ....... G02F 1/0136 359/316 |

OTHER PUBLICATIONS

Amann, Markus-Christian, et al., "Laser ranging: a critical review of usual techniques for distance measurement," Opt. Eng. 40(1), 10-19 (2001).

Chang, Lin, et al., "Ultra-efficient frequency comb generation in AlGaAs-on-insulator microresonators," Nat. Commun. 11, 1331 (2020).

Choi, Jaebum, et al., "Multi-target tracking using a 3D-Lidar sensor for autonomous vehicles," 16th International IEEE Conference on Intelligent Transportation Systems (ITSC 2013), The Hague, 2013, pp. 881-886.

Diddams, Scott A., et al., "Optical frequency combs: Coherently uniting the electromagnetic spectrum," Science, 369 (6501), eaay3676 (2020).

Duan, P., et al., "Chip-to-chip interconnects based on 3D stacking of optoelectrical dies on Si," Proc. SPIE 8267, Optoelectronic Interconnects XII, 82670U (2012).

Feneyrou, P., et al., "Frequency-modulated multifunction lidar for anemometry, range finding, and velocimetry—1. Theory and signal processing," Appl. Opt. 56, 9663-9675 (2017).

Heck, Martijn J.R., "Highly integrated optical phased arrays: photonic integrated circuits for optical beam shaping and beam steering," Nanophotonics 6 (1), 93-107 (2017).

Hibino, Yoshinori, "Recent advances in high-density and large-scale AWG multi/demultiplexers with higher index-contrast silica-based PLCs," IEEE J. Select. Topics Quantum Electron, 8(6), 1090-1101 (2002).

Holmström, Sven T. S., et al., "MEMS laser scanners: a review," J. Microelectromech. Syst., 23(2), 259-275(2014).

Jiang, Yunshan, et al., "Time-stretch LiDAR as a spectrally scanned time of-flight ranging camera," Nat. Photon. 14, 14-18(2020).

Jingye, Chen, et al., "Research progress in solid-state LiDAR," Opto-Electronic Engineering, 46(7), 190218, (2019).

Jirauschek, Christian, et al., "A theoretical description of Fourier domain mode locked lasers," Opt. Express 17, 24013-24019 (2009).

Johnson, Steven, et al., "Analysis of Geiger-mode APD laser radars," Proc. SPIE 5086, Laser Radar Technology and Applications VIII, (2003).

Karpf, Sebastian, et al., "Fourier-domain mode-locked laser combined with a master-oscillator power amplifier architecture," Opt. Lett. 44, 1952-1955 (2019).

Kimoto, Katsumi, et al., "Development of small size 3D LIDAR," IEEE International Conference on Robotics and Automation (ICRA), Hong Kong, 2014, pp. 4620-462.

Konoike, R., et al., "SOA-Integrated silicon photonics switch and its lossless multistage transmission of high-capacity WDM signals," J Lightwave Technol, 37(1), 123-130 (2019).

Lalonde, Jean-Francois, et al., "Natural terrain classification using three-dimensional ladar data for ground robot mobility," J. Field Robot. 23, 839-861 (2006).

Lee, Benjamin G., et al., Silicon Photonic Switch Fabrics: Technology and Architecture, J. Lightwave Technology, 37 (1), 2018.

Lin, Yi, et al., "Mini-UAV-Borne LIDAR for fine-scale mapping," IEEE Geosci. Remote Sens. Lett. 8(3), 426-430, (2011).

MacDonald, R. I. "Frequency domain optical reflectometer," Appl. Opt. 20, 1840-1844 (1981).

McManamon, Paul F., et al., "Comparison of flash lidar detector options," Opt. Eng. 56(3), 031223 (2017).

Mizumoto, T., et al., "Verification of waveguide-type optical circulator operation," Electronics Letters, 26(3), 199-200 (1990).

Moss, Robert, et al., "Low-cost compact MEMS scanning ladar system for robotic applications," Proc. SPIE 8379, Laser Radar Technology and Applications XVII, 837903 (2012).

Nguyen, Nam-Trung, "Micro-optofluidic lenses: a review," Biomicrofluidics, 4(3), 031501 (2010).

Okano, Masayuki, et al., "Swept Source Lidar: simultaneous FMCW ranging and nonmechanical beam steering with a wideband swept source," Opt. Express 28, 23898-23915 (2020).

Poulton, Christopher V., et al., "Coherent solid-state LIDAR with silicon photonic optical phased arrays," Opt. Lett. 42, 4091-4094 (2017).

Raja, Arslan S., et al., "Electrically pumped photonic integrated soliton microcomb," Nat Commun 10, 680 (2019).

Shen, Boqiang, et al., "Integrated turnkey soliton micro combs," Nature 582, 365-369 (2020).

Sugimoto, N., et al., "Waveguide polarization-independent optical circulator," IEEE Photon. Technol. Lett. 11, 355-357 (1999).

Svelto, Orazio "Principles of Lasers", Ray and wave propagation through optical media, 5th ed. (Springer-Verlag US 2010), 150-161.

Tateda, Mitsuhiro, et al., "Advances in optical time-domain reflectometry," J. Lightwave Technol, 7(8), 1217-1224(1989).

Tyler, Nicola A., et al., "SiN integrated optical phased arrays for two-dimensional beam steering at a single near-infrared wavelength," Opt. Express 27, 5851-5858 (2019).

Wang, Jian, et al., "On-chip silicon photonic signaling and processing: a review," Sci. Bull., 63(19), 1267-1310 (2018).

Whyte, Refael, et al., "Application of lidar techniques to time-of-flight range imaging," Appl. Opt. 54, 9654-9664 (2015).

Yang, Ki Youl, et al., "Inverse-designed non-reciprocal pulse router for chip-based LiDAR," Nat. photonics 14, 369-374 (2020).

Yao, X. Steve, et al., "Coupled opto-electronic oscillators for generating both RF signals and optical pulses," J. of Lightwave Tech., 18, 73 (2000).

Yoo, H. W., et al., "MEMS-based lidar for autonomous driving," Elektrotech. Inftech. 135, 408-415 (2018).

Zadka, Moshe, et al., "On-chip platform for a phased array with minimal beam divergence and wide field-of-view," Opt. Express 26, 2528-2534 (2018).

Zhou, Guoqing, et al., "Flash Lidar sensor using fiber-coupled APDs," IEEE Sensors Journal, 15(9), 4758-4768 (2015).

International Search Report and Written Opinion mailed May 24, 2019 for International Patent Application No. PCT/US2019/018585 (11 pages).

Baek, T.J. et al., "A 94-GHz Receiver Front End for Passive Millimeter-Wave Imaging." Proceedings of the 7th European Radar Conference, Sep. 30-Oct. 1, 2010, Paris, France.

Xu, Z. et al., "Characteristics of Subcarrier Modulation and Its Application in WDM-PONs," Journal of Lightwave Technology, vol. 27, No. 12, Jun. 15, 2009.

\* cited by examiner

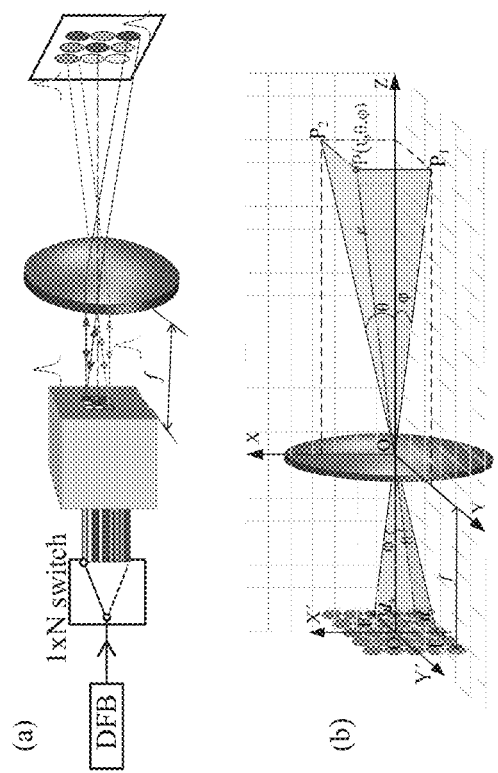
Fig. 1.(a) Illustration of an example of a beam scanning device which is enabled by waveguide switching and the position-to-angle conversion of a lens.
Fig. 1(b) Illustration of an example of the position coordinates $(d_x, d_y)$ of fiber array relative to optical axis of the lens and the space position coordinates $(r, \theta, \varphi)$ of an object at point P to be sensed.

Beam scan based on waveguide-switching and position-to-angle conversion of a lens

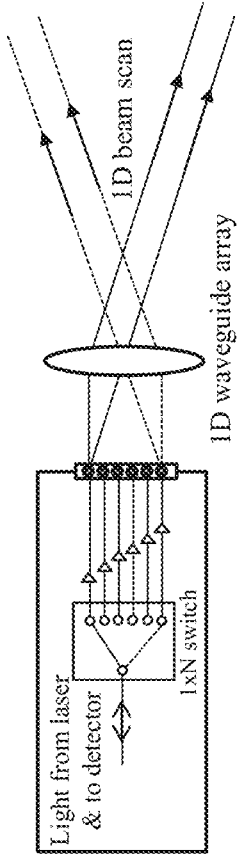

Fig. 2 Illustration of an example of 1st embodiment of a 1D beam scan device enabled by waveguide-switching on a photonic integrated circuit (PIC) and position-to-angle conversion of a lens.

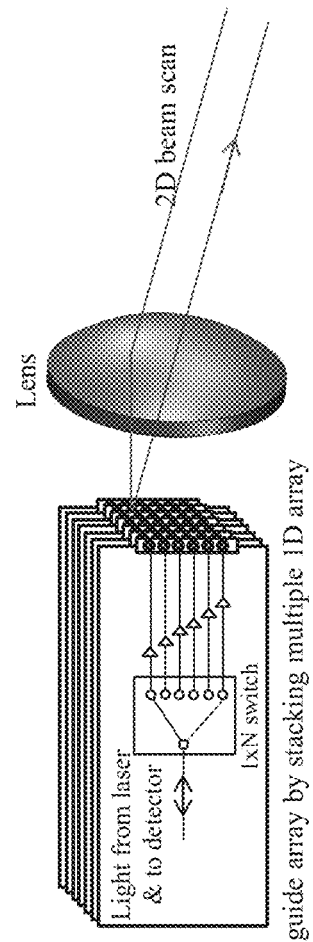

Fig. 3 Illustration of an example of 2nd embodiment of a 2D beam scan device enabled by waveguide-switching and position-to-angle conversion of a lens.

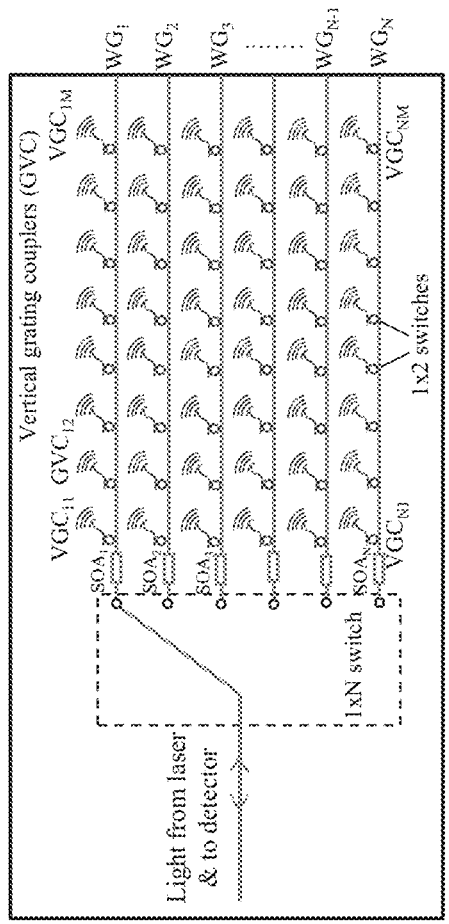
Fig.4 Illustration of an example of 3rd embodiment of a 2D beam scan device enabled by waveguide-switching on a PIC chip and position-to-angle conversion of a lens.

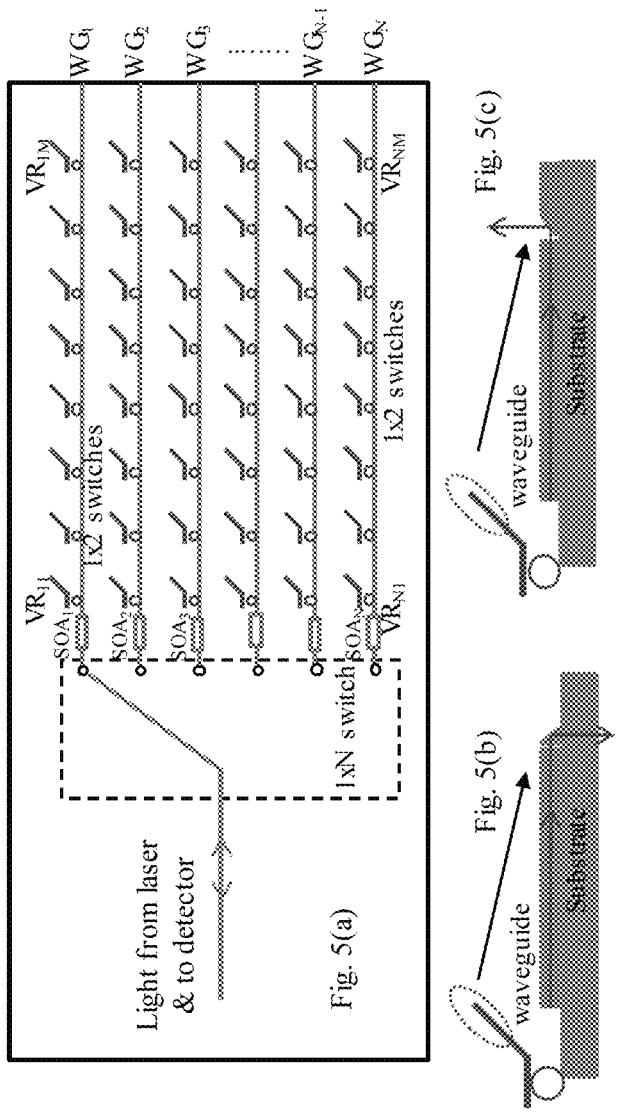
Fig. 5(a), 5(b) and 5 (c): Illustration of an example of 4th embodiment of a 2D beam scan device based on waveguide-switching on a PIC chip and position-to-angle conversion of a lens.

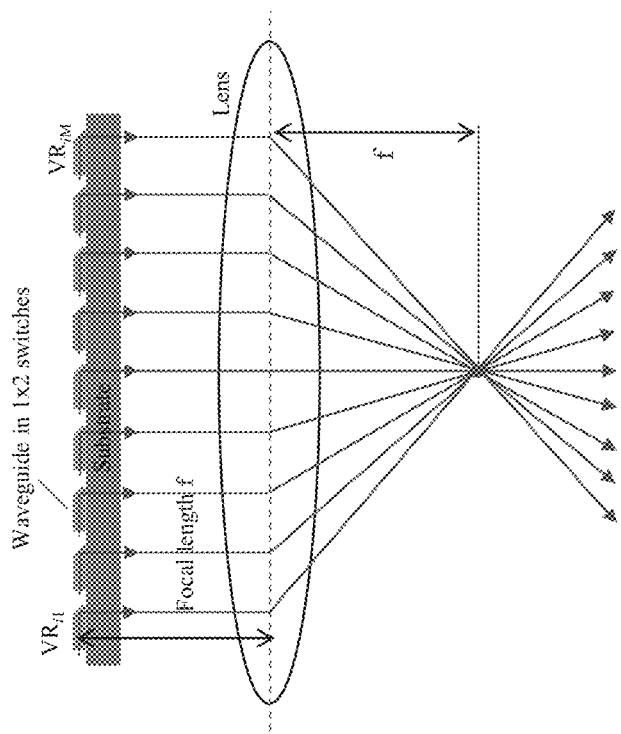
Fig. 6 Illustration of an example of a lens placed at the back of the substrate for the configuration shown in Fig. 5(b) to direct light from each switch to a different direction and therefore enable a 2D beam scan when the switches are sequentially turned on.

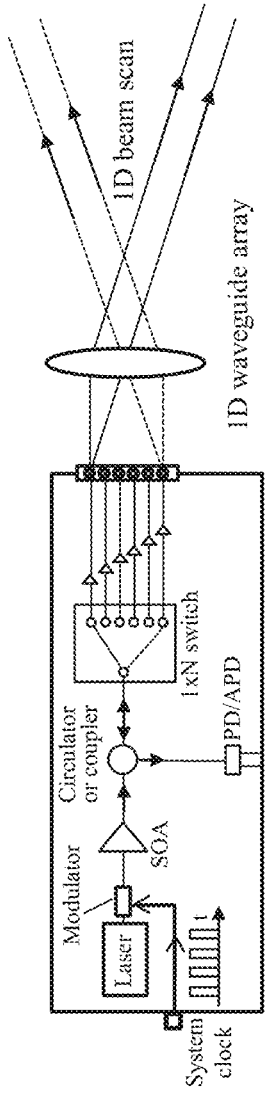
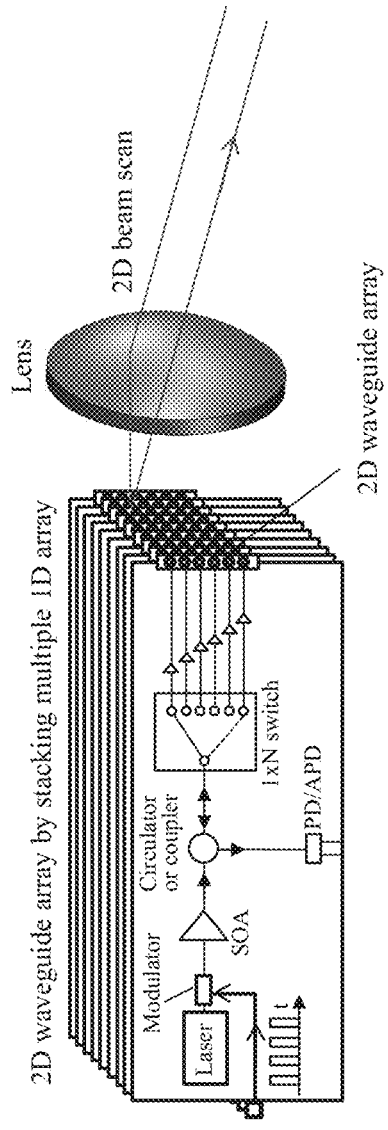

Fig. 7 Illustration of an example of 1st embodiment of a ToF Lidar based on 1D beam scan scheme enabled by waveguide-switching on a PIC chip and position-to-angle conversion of a lens in which a 1D waveguide array is used for achieving 1D beam scan.

Fig. 8 Illustration of an example of 2nd embodiment of a ToF Lidar based on waveguide-switching and position-to-angle conversion of a lens.

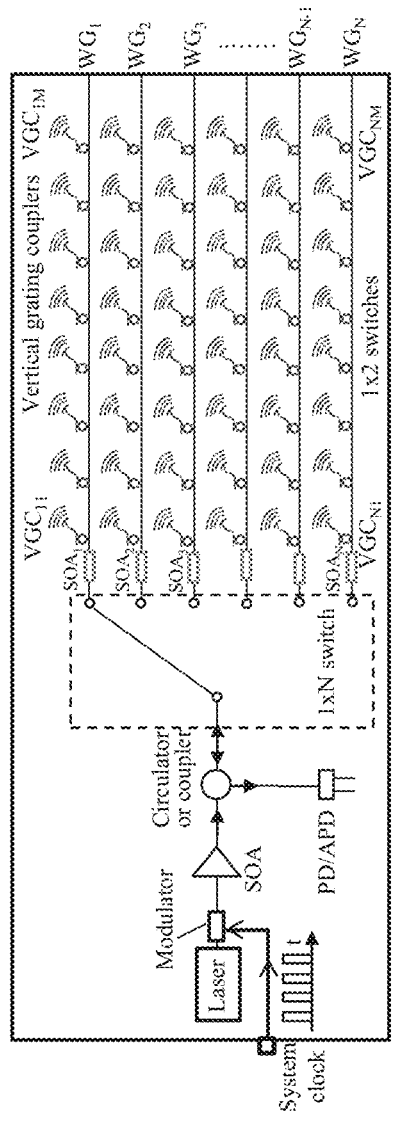
Fig. 9 Illustration of an example of 3rd embodiment of a ToF Lidar based on waveguide-switching on a PIC chip and position-to-angle conversion of a lens.

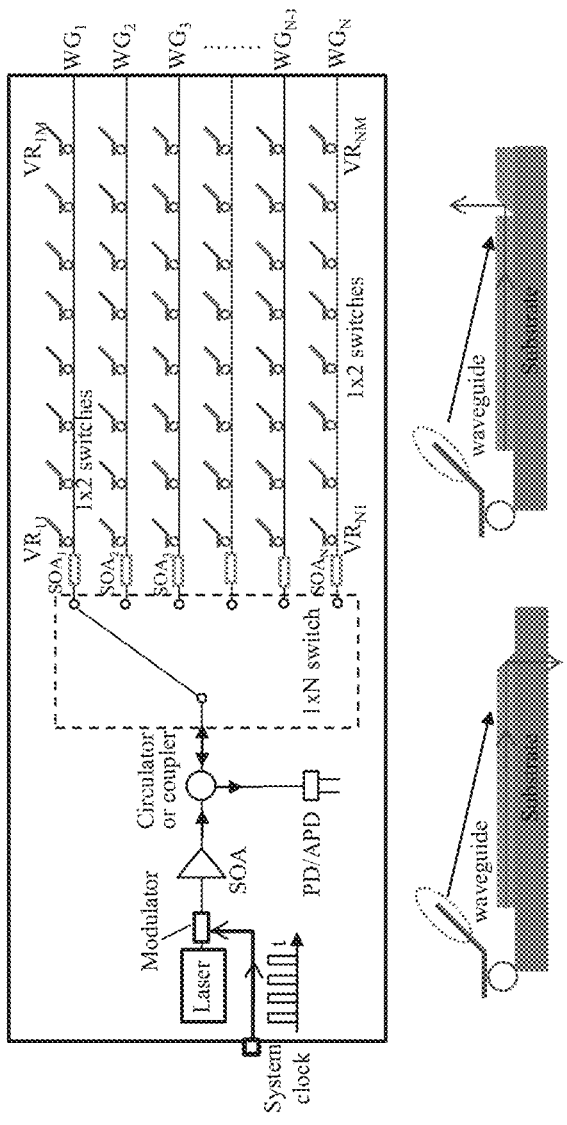
Fig. 10 Illustration of an example of 4th embodiment of a ToF Lidar based on waveguide-switching on a PIC chip and position-to-angle conversion of a lens.

Coherent Lidar based on 1D waveguide-switching and position-to-angle conversion

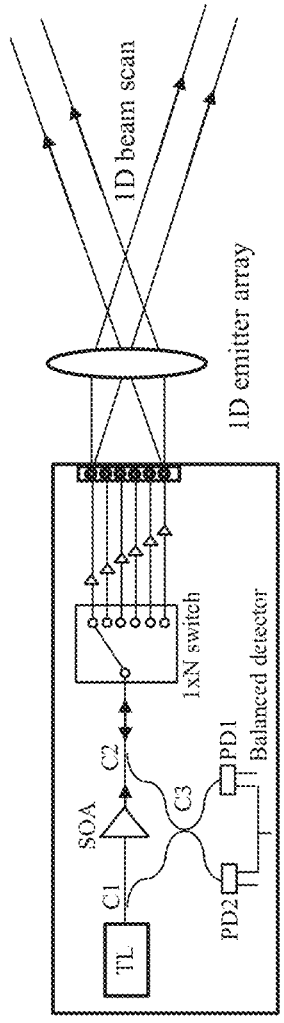

Fig. 11 Illustration of an example of 1st embodiment of a coherent Lidar based on 1D beam scan scheme enabled by waveguide-switching on a PIC chip and position-to-angle conversion of a lens in which a 1D waveguide array is used for achieving 1D beam scan.

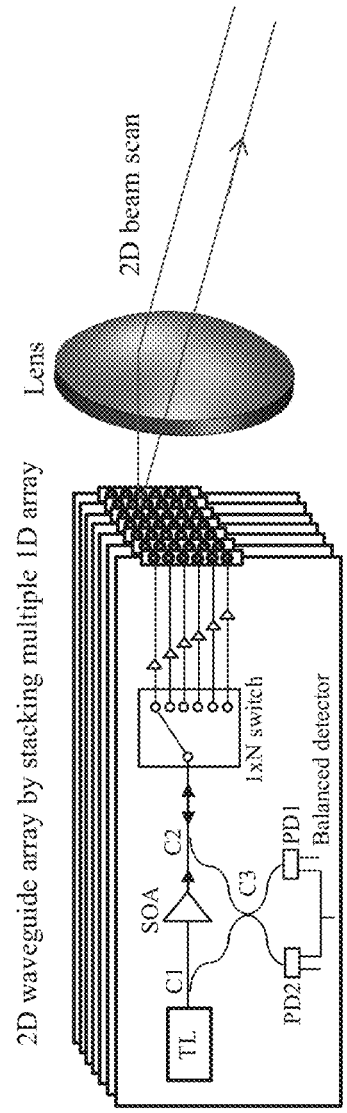

Fig. 12 Illustration of an example of 2nd embodiment of a coherent Lidar based on waveguide-switching and position-to-angle conversion of a lens.

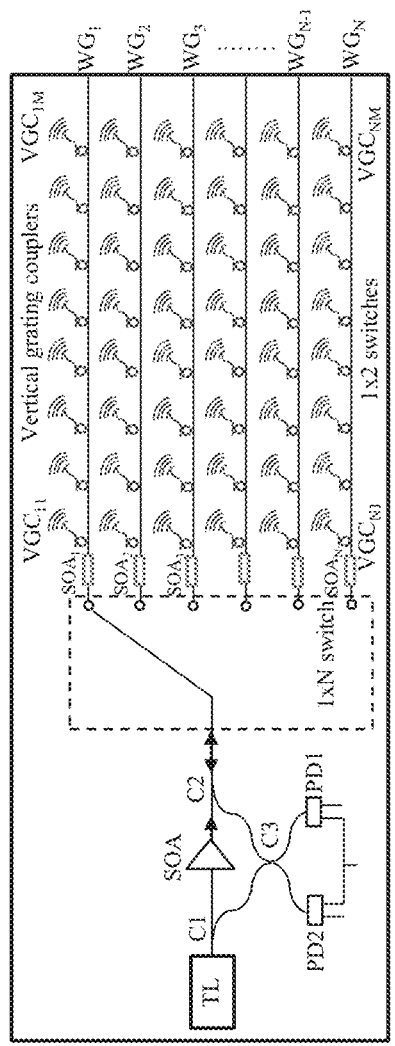
Fig. 13 Illustration of an example of 3rd embodiment of a coherent Lidar based on waveguide-switching on a PIC chip and position-to-angle conversion of a lens.

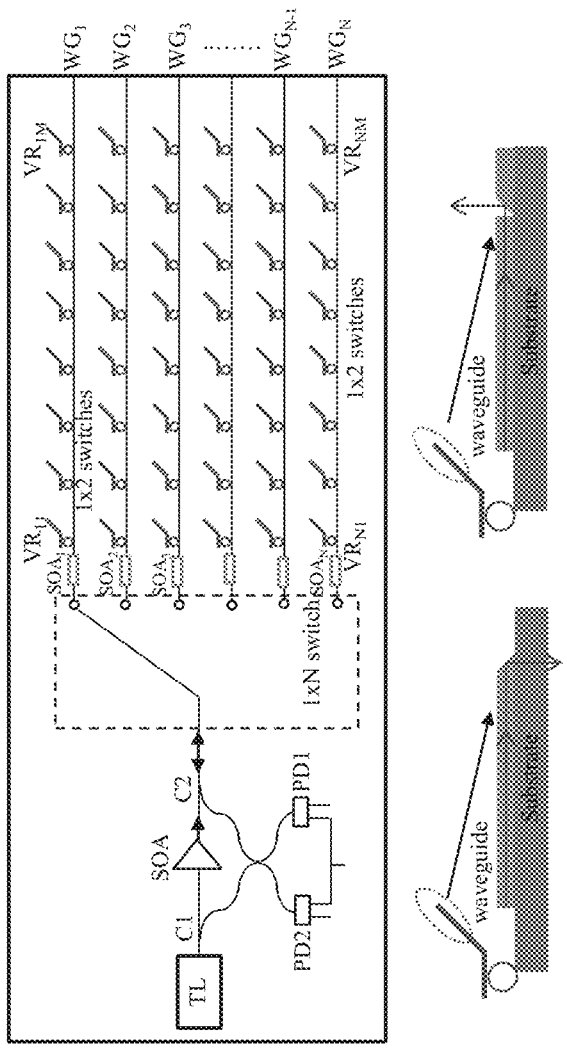
Fig. 14 Illustration of an example of 4th embodiment of a coherent Lidar based on waveguide-switching on a PIC chip and position-to-angle conversion of a lens.

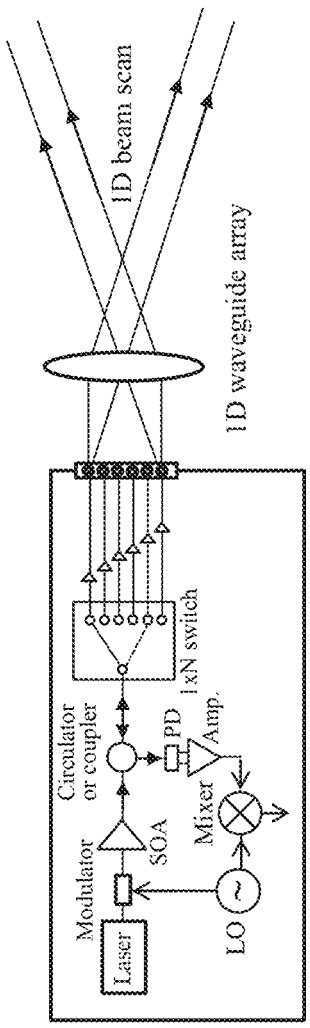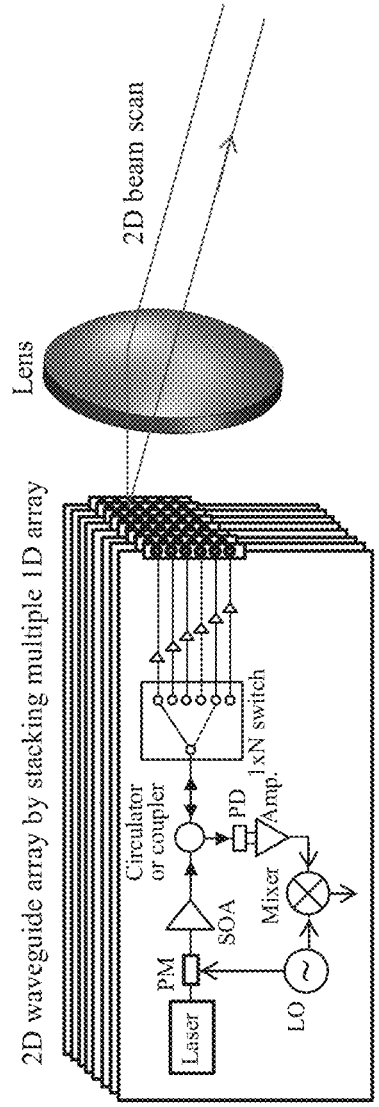

Fig. 15 Illustration of an example of 1st embodiment of a microwave photonic FWCW Lidar based on 1D beam scan scheme enabled by waveguide-switching on a PIC chip and position-to-angle conversion of a lens in which a 1D waveguide array is used for achieving 1D beam scan.

Fig. 16 Illustration of an example of 2nd embodiment of a microwave photonic FWCW Lidar based on stacked 1D waveguide-switching and position-to-angle conversion of a lens.

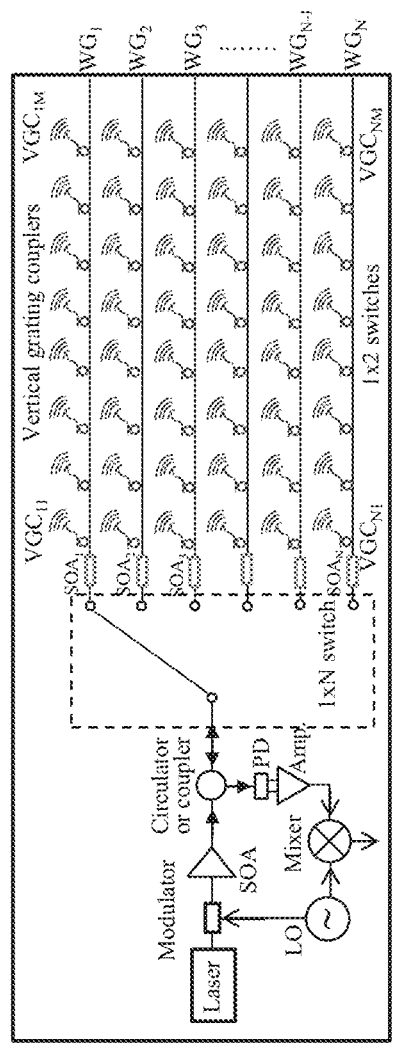
Fig. 17 Illustration of an example of 3rd embodiment of a microwave photonic FMCW Lidar based on 2D waveguide-switching on a PIC chip and position-to-angle conversion of a lens.

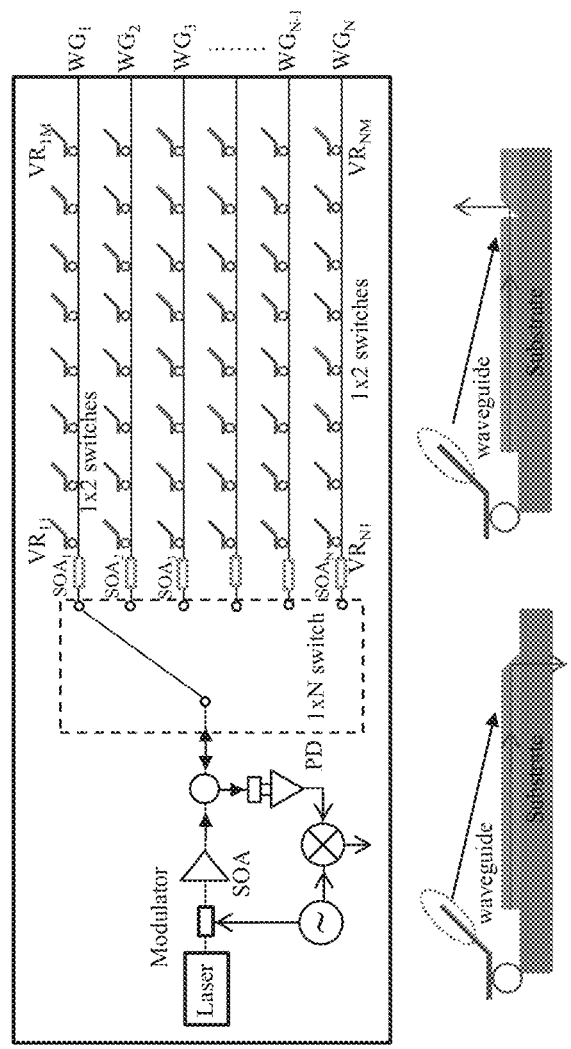
Fig. 18 Illustration of an example of 4th embodiment of a microwave photonic FMCW Lidar based on 2D waveguide-switching on a PIC chip and position-to-angle conversion of a lens.

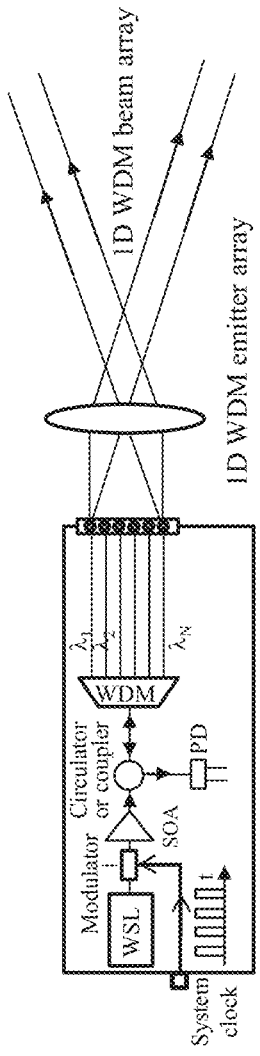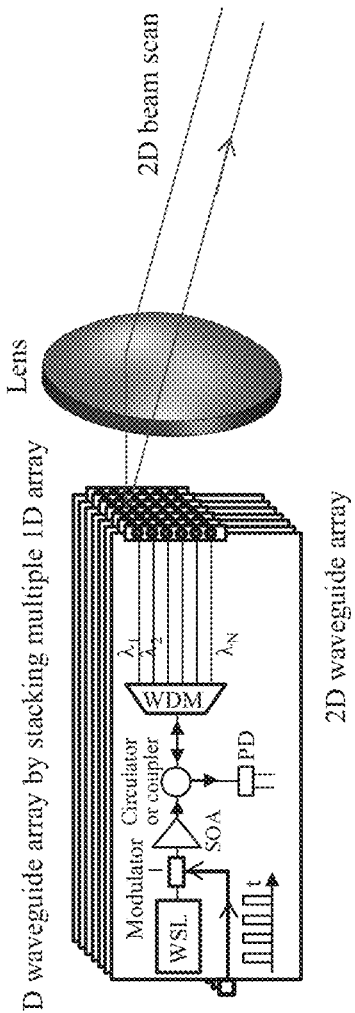

Fig. 19 Illustration of an example of 1st embodiment of a wavelength-stepping ToF Lidar based on 1D beam scan scheme enabled by waveguide-switching on a PIC chip and position-to-angle conversion of a lens in which a 1D waveguide array is used for achieving 1D beam scan.

Fig. 20 Illustration of an example of 2nd embodiment of a wavelength-stepping ToF Lidar based on 1D stacked waveguide-switching and position-to-angle conversion of a lens.

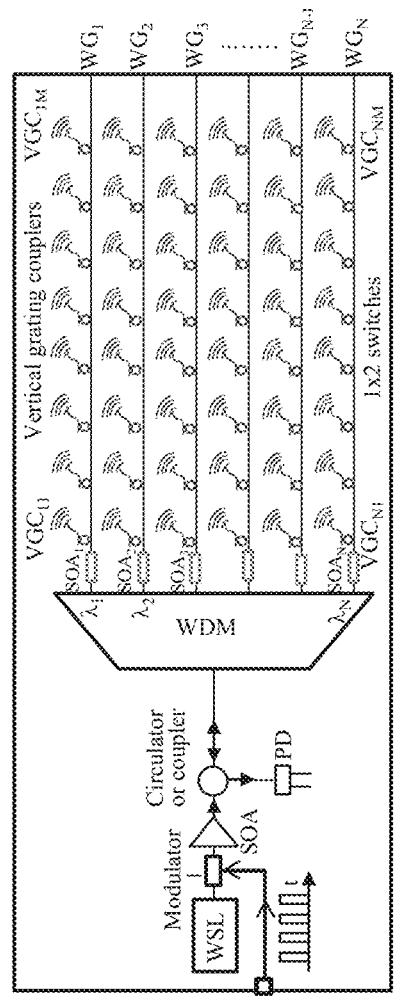
Fig. 21 Illustration of an example of 3rd embodiment of a wavelength-stepping ToF Lidar based on waveguide-switching on a PIC chip and position-to-angle conversion of a lens.

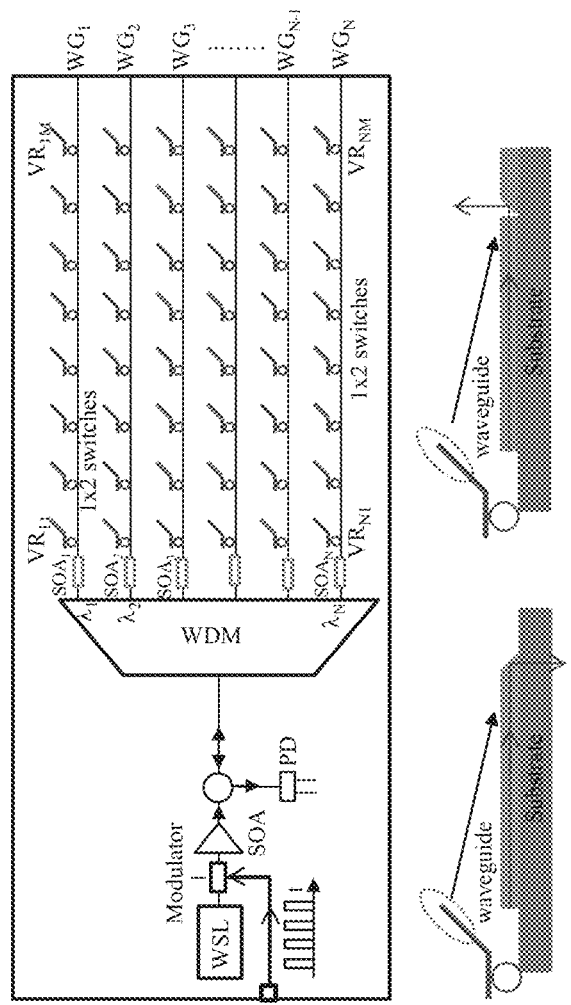
Fig. 22 Illustration of an example of 4th embodiment of a wavelength-stepping ToF Lidar based on 2D waveguide-switching on a PIC chip and position-to-angle conversion of a lens.

ToF Lidar based on
combination of wavelength division demultiplexing,
1x2 switching, and position-to-angle conversion

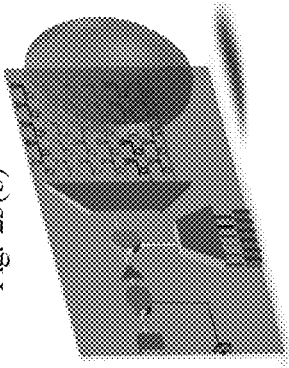

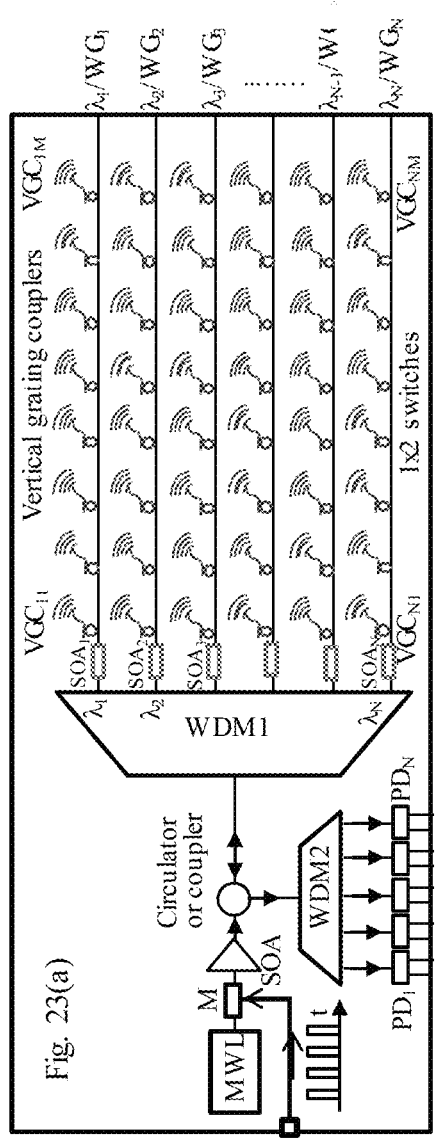

Fig. 23(a) Illustration of an example of 1st embodiment of a multi-wavelength ToF Lidar based on the combination of WDM, waveguide-switching on a PIC chip, and position-to-angle conversion of a lens.

Fig. 23(b) Illustration of an example of placing the chip in the focal place of a lens to enable beam collimation and scan. An optional bi-directional SOA (SOAi) may be placed in each waveguide to amplify light going into and received from the VGC's.

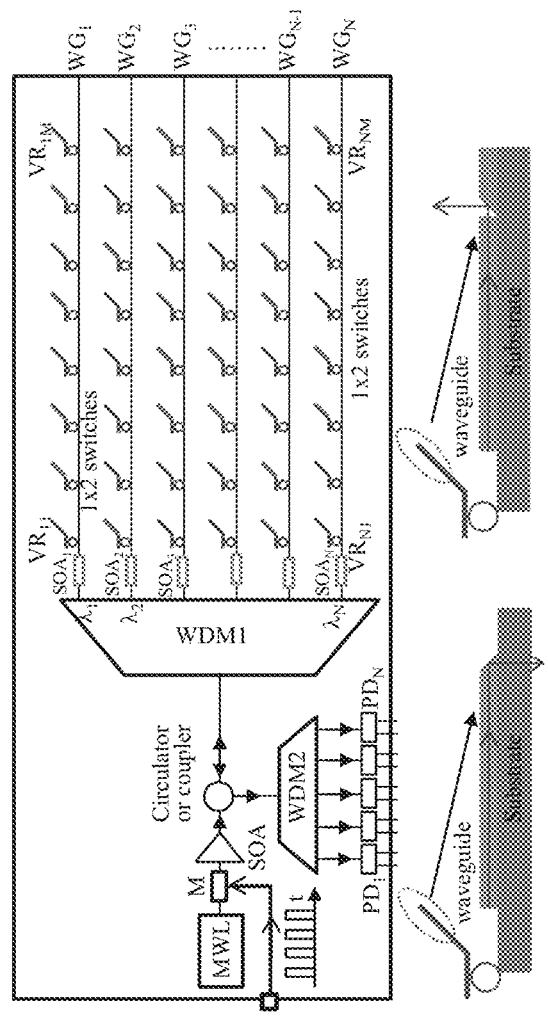
Fig. 24 Illustration of an example of 2nd embodiment of a multi-wavelength ToF Lidar based on the combination of WDM, waveguide-switching on a PIC chip and position-to-angle conversion of a lens.

OPTICAL BEAM SCANNING BASED ON WAVEGUIDE SWITCHING AND POSITION-TO-ANGLE CONVERSION OF A LENS AND APPLICATIONS

PRIORITY CLAIM AND RELATED APPLICATIONS

This patent document claims priority to and benefits of U.S. Patent Application No. 63/094,338 of the same title filed on Oct. 20, 2020. The entire content of the before-mentioned patent application is incorporated by reference as part of the disclosure of this application.

TECHNICAL FIELD

This patent document is directed to techniques, devices and applications for scanning an optical beam.

BACKGROUND

Optical scanning of light is used in various optical devices and systems. Applications based on three dimensional (3D) optical sensing use optical scanning to scan probe light to a desired target area. Various light detection and ranging (LiDAR) systems are 3D optical sensing and is used a wide range of applications, including autonomous vehicles, unmanned aerial vehicles (UAV), robotics, industrial automation, 3D reality capturing, and aerial mapping due to its high spatial and angular resolution not attainable with Radar systems.

SUMMARY

This patent document discloses techniques and devices for beam scanning using optical waveguides and an optical lens without moving parts or the need for phase tuning as in optical phased array (OPA). Examples provided in this patent document use a combination of a lens' position-to-angle conversion and switching light from a source to multiple waveguides or fibers. The exiting ends of these waveguides form a 1D or 2D array, which is then placed in the focal plane of the lens. The lens converts the exiting lights into beams of different angles to form a 1D or 2D beam array according to the relative position of the fiber ends with respect to the optical axis of the lens for illuminating the targets and finally sensing the light reflected from different directions. The returned signals are then directed to a photodetector to determine the distances of the reflections in different directions sequentially using any type of ranging techniques, such as time of flight (ToF), coherent detection with a frequency modulated continuous wave (FMCW) laser, or microwave photonic FMCW source.

In various applications, the disclosed beam scanning device can be implemented in photonics integrated circuit (PIC) for low cost production or be combined with a wavelength division multiplexing (WDM) beamforming device to reduce the number of switches required, as well as enable line-scanning without moving parts. The disclosed beam scanning device may also be used as an attractive alternative to the MEMS and optical phased array based beam scanning and can enable low cost and high speed 3D sensing, particularly Lidar systems. For commercial applications, the disclosed beam scanning device can be configured to enable compact device packages and relative low cost production and thus provide cost-effective integrated systems solutions that produce performance, size, and weight advantages.

In one implementation, the disclosed technology can be implemented to provide an optical beam scanning device that includes an array of optical waveguides spaced from one another at different positions to have waveguide output ports at or near a common plane; an optical switch coupled to direct an optical beam to the array of the optical waveguides and operable to, in response to a control signal, direct the optical beam to one of the optical waveguides at a time to sequentially direct the optical beam to the optical waveguides so that the optical beam sequentially appears at the waveguide output ports, one waveguide at time; and a lens spaced from the common plane of the waveguide output ports by a distance equal to or near a focal length of the lens to receive the optical beam from the waveguide output ports to direct the optical beam from each waveguide to a unique beam direction based on a position of a waveguide output port of the each waveguide in the common plane relative to the lens so that the optical beam directed from different waveguide output ports is directed by the lens to different directions by the lens.

In another implementation, the disclosed technology can be implemented to provide another optical beam scanning device which includes a substrate and an array of optical waveguides supported by the substrate and spaced from one another at different positions. This optical beam scanning device further includes a first optical switch supported by the substrate and located to direct an optical beam to the array of the optical waveguides and operable to, in response to a control signal, direct the optical beam to one of the optical waveguides at a time to sequentially direct the optical beam to the optical waveguides; optical couplers formed at different locations adjacent to the optical waveguides so that each optical waveguide is designated with, and corresponds to, a plurality of optical couplers along the each optical waveguide, each optical coupler structured to receive light from a corresponding optical waveguide and to direct the received light out of a plane of the substrate; second optical switches formed at different locations adjacent to the optical waveguides so that each optical waveguide is designated with, corresponds to, a plurality of second optical switches along the each optical waveguide, wherein each second optical switch is coupled to a designated optical waveguide to either direct light out of the designated optical waveguide or to maintain the light in the designated optical waveguide, and each second optical switch is located and paired to a designated optical coupler and structured to couple light from a corresponding designated optical waveguide to the paired designated optical coupler which directs light from the each second optical switch out of the plane of the substrate as an optical output beam. This optical beam scanning device includes a lens spaced from substrate by a distance equal to or near a focal length of the lens to receive the optical output beam from the optical couplers to direct the optical output beam from each optical coupler to a unique beam direction based on a position of the optical relative to the lens so that the optical output beam directed from different optical couplers is directed by the lens to different directions by the lens.

In various implementations, the above and other optical beam scanning devices disclosed herein can be used to construct a light detection and ranging (LiDAR) device. Such a LiDAR device can include a light source to produce an optical beam; a beam scanning device located in an optical path of the optical beam to direct and scan the optical beam to a surrounding area for LiDAR sensing and to receive returned light from the surrounding area illuminated by the optical beam; an optical circulator located in the optical path between the light source and the beam scanning device to direct the optical beam from the light source to the beam scanning device and to receive and direct the returned light received by the beam scanning device as a detected returned beam that is separate from the optical beam from the light source; and an optical detector coupled to receive the detected returned beam from the optical circulator and to produce a detector output signal for LiDAR sensing.

In yet another implementation, the disclosed technology can be used to provide a light detection and ranging (LiDAR) device which includes a light source to produce an optical beam that includes laser light at different laser wavelengths; a beam scanning device located in an optical path of the optical beam to direct and scan the optical beam to a surrounding area for LiDAR sensing and to receive returned light from the surrounding area illuminated by the optical beam; an optical circulator located in the optical path between the light source and the beam scanning device to direct the optical beam from the light source to the beam scanning device and to receive and direct the returned light received by the beam scanning device as a detected returned beam that is separate from the optical beam from the light source; a wavelength division multiplexing device to receive the detected returned beam from the optical circulator and to separate the detected returned beam into different detected optical beams at the different laser wavelengths; and an optical detector array of photodetectors coupled to receive the different detected optical beams at the different laser wavelengths from the wavelength division multiplexing device, respectively, to produce different detector output signals from the different detected optical beams at the different laser wavelengths for LiDAR sensing.

The beam scanning device in the above LiDAR device is structured to include: a wavelength division demultiplexing device to receive the optical beam from the light source that includes laser light at the different laser wavelengths from the optical circulator and to separate the received optical beam into different optical beams at the different laser wavelengths, respectively; and an array of optical waveguides coupled to receive the different optical beams at the different laser wavelengths, respectively, from the wavelength division demultiplexing device; optical couplers formed at different locations adjacent to the optical waveguides so that each optical waveguide is designated with, and corresponds to, a plurality of optical couplers along the each optical waveguide. Each optical coupler is structured to receive light from a corresponding optical waveguide and to direct the received light out of a plane of the substrate. The beam scanning device also includes optical switches formed at different locations adjacent to the optical waveguides so that each optical waveguide is designated with, corresponds to, a plurality of optical switches along the each optical waveguide, wherein each optical switch is coupled to a designated optical waveguide to either direct light out of the designated optical waveguide or to maintain the light in the designated optical waveguide, and each optical switch is located and paired to a designated optical coupler and structured to couple light from a corresponding designated optical waveguide to the paired designated optical coupler which directs light from the each optical switch out of a plane of the optical waveguides as an optical output beam. A lens is also provided in the beam scanning device and is spaced from the plane of the optical waveguides by a distance equal to or near a focal length of the lens to receive the optical output beam from the optical couplers to direct the optical output beam from each optical coupler to a unique beam direction based on a position of the optical relative to the lens so that the optical output beam directed from different optical couplers is directed by the lens to different directions by the lens.

Those and other features and implementations of the disclosed beam scanning technology and their applications in LiDAR and other applications are described in greater detail in the drawings, the description and the claims.

BRIEF DESCRIPTION OF THE DRAWINGS

FIG. 1(a) shows an example of a beam scanning device enabled by waveguide switching and the position-to-angle conversion of a lens. Light from a source can be switched into different fibers/waveguides with their exiting ends forming an array, which is placed on the focal plane of the lens.

FIG. 1(b) shows an example of the position coordinates (dx, dy) of fiber array relative to optical axis of the lens and the space position coordinates (r, θ, φ) of an object at point P to be sensed, where r is the distance of the object from the lens, θ is the vertical beam deflection angle measured from the YOZ plane, and o is the horizontal beam deflection angle from the XOZ plane. OP1 is the projection of OP in plane YOZ, OP2 is the projection of OP in plane XOZ.

FIG. 2 shows an example of a 1st embodiment of 1D beam scan device enabled by waveguide-switching on a photonic integrated circuit (PIC) and position-to-angle conversion of a lens. A 1D waveguide array is used for achieving 1D beam scan.

FIG. 3 shows an example of a 2nd embodiment of a 2D beam scan device enabled by waveguide-switching and position-to-angle conversion of a lens. Multiple 1D waveguide array PIC chips are stacked together to form a 2D array for achieving 2D beam scans.

FIG. 4 shows an example of a 3rd embodiment of a 2D beam scan device enabled by waveguide-switching on a PIC chip and position-to-angle conversion of a lens. The vertical grating couplers (VGC) are used to couple light out of the waveguide plane and multiple 1×2 switches are used to direct the light in each waveguide (WGn) to each VGC sequentially. The 2D waveguide and VGC array can be placed in the focal plane of a lens to convert light from each VGC to a beam with a unique direction. Beam scan is realized by switching light into each waveguide and then switching to each VGCij sequentially. An optional bi-directional SOA (SOAi) may be placed in each waveguide to amplify light going into and received from the VGC's.

FIGS. 5(a), 5(b) and 5(c) show an example of a 4th embodiment of a 2D beam scan device based on waveguide-switching on a PIC chip and position-to-angle conversion of a lens. The vertical reflectors (VR) are etched on the end of the waveguide to couple light out of the substrate plane vertically or near-vertically either from front or back of the substrate and multiple 1×2 switches are used to direct the light to each VR sequentially. Beam scan is realized by switching light into each waveguide and then switching to each VRij sequentially. An optional bi-directional SOA (SOAi) may be placed in each waveguide to amplify light going into and received from the VGC's.

FIG. 6 shows an example of a lens placed at the back of the substrate for the configuration shown in FIG. 5(b) to direct light from each switch to a different direction and therefore enable a 2D beam scan when the switches are sequentially turned on. Similarly, a lens can also put on the front of the substrate for the configuration shown in FIG. 5(c) to enable 2D beam scan when corresponding switches are turned on sequentially.

FIG. 7 shows an example of a 1st embodiment of a ToF Lidar based on 1D beam scan scheme enabled by waveguide-switching on a PIC chip and position-to-angle conversion of a lens in which a 1D waveguide array is used for achieving 1D beam scan. The SOA can also be used both as a modulator and an amplifier.

FIG. 8 shows an example of a 2nd embodiment of a ToF Lidar based on waveguide-switching and position-to-angle conversion of a lens. Multiple 1D waveguide array PIC chips are stacked together to for a 2D array for achieving 2D beam scans.

FIG. 9 shows an example of a 3rd embodiment of a ToF Lidar based on waveguide-switching on a PIC chip and position-to-angle conversion of a lens. The vertical grating couplers (VGC) are used to couple light out of the waveguide plane and multiple 1×2 switches are used to direct the light to each VGC sequentially. Beam scan is realized by switching light into each waveguide and then switching to each VGCij sequentially. An optional bi-directional SOA (SOAi) may be placed in each waveguide to amplify light going into and received from the VGC's.

FIG. 10 shows an example of a 4th embodiment of a ToF Lidar based on waveguide-switching on a PIC chip and position-to-angle conversion of a lens. The vertical reflectors (VR) are etched on the end of the waveguide to couple light out of the substrate plane vertically either from front or back of the substrate and multiple 1×2 switches are used to direct the light to each VR sequentially. Beam scan is realized by switching light into each waveguide and then switching to each VRij sequentially. An optional bi-directional SOA (SOAi) may be placed in each waveguide to amplify light going into and received from the VGC's.

FIG. 11 shows an example of a 1st embodiment of a coherent Lidar based on 1D beam scan scheme enabled by waveguide-switching on a PIC chip and position-to-angle conversion of a lens in which a 1D waveguide array is used for achieving 1D beam scan. TL: Tunable laser, C1: ~1% coupler, C2: ~50% coupler, C3: ~50% coupler FIG. 12 shows an example of a 2nd embodiment of a coherent Lidar based on waveguide-switching and position-to-angle conversion of a lens. Multiple 1D waveguide PIC array are stacked together to for a 2D array for achieving 2D beam scans. TL: Tunable laser, C1: ~1% coupler, C2: ~50% coupler, C3: ~50% coupler FIG. 13 shows an example of a 3rd embodiment of a coherent Lidar based on waveguide-switching on a PIC chip and position-to-angle conversion of a lens. The vertical grating couplers (VGC) are used to couple light out of the waveguide plane and multiple 1×2 switches are used to direct the light to each VGC sequentially. Beam scan is realized by switching light into each waveguide and then switching to each VGCij sequentially. TL: Tunable laser, C1: ~1% coupler, C2: ~50% coupler, C3: ~50% coupler. An optional bi-directional SOA (SOAi) may be placed in each waveguide to amplify light going into and received from the VGC's.

FIG. 14 shows an example of a 4th embodiment of a coherent Lidar based on waveguide-switching on a PIC chip and position-to-angle conversion of a lens. The vertical reflectors (VR) are etched on the end of the waveguide to couple light out of the substrate plane vertically either from front or back of the substrate and multiple 1×2 switches are used to direct the light to each VR sequentially. Beam scan is realized by switching light into each waveguide and then switching to each VRij sequentially. An optional bi-directional SOA (SOAi) may be placed in each waveguide to amplify light going into and received from the VGC's.

FIG. 15 shows an example of a 1st embodiment of a microwave photonic FWCW Lidar based on 1D beam scan scheme enabled by waveguide-switching on a PIC chip and position-to-angle conversion of a lens in which a 1D waveguide array is used for achieving 1D beam scan. LO: local oscillator, M: modulator FIG. 16 shows an example of a 2nd embodiment of a microwave photonic FWCW Lidar based on stacked 1D waveguide-switching and position-to-angle conversion of a lens. Multiple 1D waveguide PIC array are stacked together to for a 2D array for achieving 2D beam scans. LO: local oscillator, M: modulator FIG. 17 shows an example of a 3rd embodiment of a microwave photonic FWCW Lidar based on 2D waveguide-switching on a PIC chip and position-to-angle conversion of a lens. The vertical grating couplers (VGC) are used to couple light out of the waveguide plane and multiple 1×2 switches are used to direct the light to each VGC sequentially. Beam scan is realized by switching light into each waveguide and then switching to each VGCij sequentially. LO: local oscillator. An optional bi-directional SOA (SOAi) may be placed in each waveguide to amplify light going into and received from the VGC's.

FIG. 18 shows an example of a 4th embodiment of a microwave photonic FMCW Lidar based on 2D waveguide-switching on a PIC chip and position-to-angle conversion of a lens. The vertical reflectors (VR) are etched on the end of the waveguide to couple light out of the substrate plane vertically either from front or back of the substrate and multiple 1×2 switches are used to direct the light to each VR sequentially. Beam scan is realized by switching light into each waveguide and then switching to each VRij sequentially. An optional bi-directional SOA (SOAi) may be placed in each waveguide to amplify light going into and received from the VGC's.

FIG. 19 shows an example of a 1st embodiment of a wavelength-stepping ToF Lidar based on 1D beam scan scheme enabled by waveguide-switching on a PIC chip and position-to-angle conversion of a lens in which a 1D waveguide array is used for achieving 1D beam scan. Waveguide switching is enabled by scanning or stepping the wavelength of the laser. WSL: wavelength-stepping laser; M: Modulator, can be MZM or an electro-absorption modulator, or simply using an SOA as both the modulator and amplifier; WDM: wavelength division multiplexer/demultiplxer.

FIG. 20 shows an example of a 2nd embodiment of a wavelength-stepping ToF Lidar based on 1D stacked waveguide-switching and position-to-angle conversion of a lens. Multiple 1D waveguide PIC array are stacked together to for a 2D array for achieving 2D beam scans. SWL: swept-wavelength laser; M: Modulator, can be MZM or an electro-absorption modulator, or simply using an SOA as both the modulator and amplifier. WDM: wavelength division multiplexer/demultiplxer.

FIG. 21 shows an example of a 3rd embodiment of a wavelength-stepping ToF Lidar based on waveguide-switching on a PIC chip and position-to-angle conversion of a lens. The vertical grating couplers (VGC) are used to couple light out of the waveguide plane and multiple 1×2 switches are used to direct the light to each VGC sequentially. Beam scan is realized by first stepping the WSL to wavelength i so that the WDM can direct the light into waveguide WGi, which is then switched to each VGCij sequentially. WSL: wavelength-stepping laser; M: Modulator, can be MZM or an electro-absorption modulator, or simply using an SOA as both the modulator and amplifier. An optional bi-directional SOA (SOAi) may be placed in each waveguide to amplify light going into and received from the VGC's.

FIG. 22 shows an example of a 4th embodiment of a wavelength-stepping ToF Lidar based on 2D waveguide-switching on a PIC chip and position-to-angle conversion of a lens. The vertical reflectors (VR) are etched on the end of the waveguide to couple light out of the substrate plane vertically either from front or back of the substrate and multiple 1×2 switches are used to direct the light to each VR sequentially. Beam scan is realized by switching light into each waveguide by stepping the wavelength of the WSL and then switching to each VRij sequentially. SWL: wavelength-stepping laser; M: Modulator, can be MZM or an electro-absorption modulator, or simply using an SOA as both the modulator and amplifier. An optional bi-directional SOA (SOAi) may be placed in each waveguide to amplify light going into and received from the VGC's.

FIG. 23a shows an example of a 1st embodiment of a multi-wavelength ToF Lidar based on the combination of WDM, waveguide-switching on a PIC chip, and position-to-angle conversion of a lens. A multi-wavelength laser with N different wavelengths is modulated and amplified before being demultiplexed into N waveguides. There are M 1×2 switches along each waveguide to switch light out to a vertical grating couplers (VGC) for coupling light out of the waveguide plane sequentially. The VGC's on each waveguide are designed for the corresponding wavelengths. All the VGC's form an emitter plane and are placed in the focal plane of a lens to collimate them into different directions. Multiple beams can be scanned simultaneously by simultaneously turning a switch on each waveguide. A line scan of N optical beams can be realized. MWL: multi-wavelength laser; M: Modulator, can be MZM or an electro-absorption modulator, or simply using an SOA as both the modulator and amplifier.

FIG. 23b shows an example of placing the chip in the focal place of a lens to enable beam collimation and scan. An optional bi-directional SOA (SOAi) may be placed in each waveguide to amplify light going into and received from the VGC's.

FIG. 24 shows an example of a 2nd embodiment of a multi-wavelength ToF Lidar based on the combination of WDM, waveguide-switching on a PIC chip and position-to-angle conversion of a lens. The vertical reflectors (VR) are etched on the end of the waveguides of the 1×2 switches to couple light out of the substrate plane vertically either from front or back of the substrate and multiple 1×2 switches are used to direct the light to each VR sequentially. A multi-wavelength laser with N different wavelengths is modulated and amplified before being demultiplexed into N waveguides. There are M 1×2 switches along each waveguide to switch light out to each VR sequentially to enable beam scan. N wavelengths can be synchronously switched to enable line scanning. MWL: multi-wavelength laser; M: Modulator, can be MZM or an electro-absorption modulator, or simply using an SOA as both the modulator and amplifier. An optional bi-directional SOA (SOAi) may be placed in each waveguide to amplify light going into and received from the VGC's.

DETAILED DESCRIPTION

In various applications, a 3D sensing/Lidar system may be used to perform ranging and beam forming. The ranging is to measure the distance of a light reflecting object from the system (the z coordinate), which can be accomplished using the optical time domain reflectometry (OTDR) technique (commonly referred to as time-of-flight (TOF) LiDAR), and the optical frequency domain reflectometry (OFDR) technique (often referred to as chirped Lidar, coherence Lidar or frequency-modulated continuous wave (FMCW) Lidar). beam forming is to illuminate the space either sequentially or parallel to enable the system to identify the angular direction of the beam reflected by the object for determining its transverse spatial location (the x and y coordinates). The early adopted sequential beam forming techniques, including the 360-degree rotation of the optical beam by a motor and the 1D and 2D vibrating mirrors, are based mechanical motions and suffer from wear and tear, relatively low scanning rate, large size and high cost. MEMS based 2D scanning mirror were later developed with much smaller size and lower cost. Finally, an optical phase array (OPA) with photonics integrated circuit was developed to enable 2D beam scan with potentially low cost and high speed without any mechanical motion. However, a major issue associated with OPA is the small beam size or large beam divergence angle, which limits the sensing distance. In addition, the precise control of the relative phases of hundreds of the array elements is a challenge, compromising the beam quality (with large side lobes) and pointing accuracy if not precisely controlled.

Beam forming with no moving parts (inertia-free) is desirable for fast imaging and immunity against vibration. For this reason, a scan-less 3D sensing/Lidar was developed by a team at M.I.T., which used a silicon Geiger-mode APD arrays with an integrated timing circuitry for each pixel, to build 3D Lidar. This flash imaging Lidar is a laser-based 3-D imaging system in which a large area is illuminated by each laser pulse and a focal plane array (FPA) is used to simultaneously detect light from thousands of adjacent directions. However, because in this scheme a larger number of pixels must be simultaneously illuminated, much higher laser power is required as compared to a beam scanning systems to attain the same return signal power due to the spreading of the laser power over the entire field of view (FOV).

A time-stretch Lidar can be designed to use a broadband source (from a gain-switched supercontinuum laser) or a Fourier Domain Mode-Locked Laser (FDML) was spectro-temporally modulated into a train of discrete pulses with varying central wavelengths. The spectro-temporally multiplexed pulses are diffracted in space to discrete collimated beams so that different wavelengths illuminate targets in different angles at the beginning of each corresponding time window. The returned spectro-temporal echoes are received by a single-pixel detector with internal gain and digitally processed to recover the depth image. The spectro-temporal encoding eliminates the ambiguity of mapping between time, wavelength and lateral position in spectral Lidar imaging, as well as permits single-pixel detection and demodulation without a spectrometer. The disadvantage is that greater laser pulse energy is required to simultaneously illuminate over the entire FOV. Meanwhile, the returned spectro-temporal echoes are received by a single-pixel, which may limit the imaging speed.

The disclosed beam scanning without moving parts or the need for phase tuning as in optical phased array (OPA) can be implemented to meet various beam scanning requirements in applications by switching light from a source into different waveguides whose exit ends form a 1D or 2D array, which is placed in the focal plane of a lens. Light exiting each waveguide is collimated and directed into a unique direction according to its relative position with respect to the optical axis of the lens. The beam scanning can be accomplished by sequentially switching the light into each waveguide. The returned signal of each beam can be focused back into their perspective waveguides/fibers by the same lens and then directed a photodetector (PD) to determine the distances of the reflections in different directions. This design can be implemented in photonics integrated circuit (PIC) for low cost production. Compared with beam scanning using an OPA, this design does not require precise and fast phase tuning of a large number of waveguides and provides reduced complexity in the device structure and reduces power consumption. In addition, the beam size and beam quality of this design can be much bigger and better, respectively, comparing with what can be achieved with an OPA. This beam forming design can be used to realize different Lidar systems with different ranging schemes, such as those based on ToF, coherent detection based on FMCW laser, and microwave photonic FMCW. Such PIC based Lidars have great potentials in autonomous vehicles, unmanned aerial vehicles (UAV's), industrial robotics, and 3D reality capturing.

FIG. 1 shows an example of a 3D beam forming and scanning device based on the disclosed technology. FIG. 1(a) show the basic structure of the device and FIG. 1(b) shows the operation of the device.

Referring to FIG. 1(a), light from a source, such as a distributed feedback (DFB) semiconductor laser, is guided in a waveguide/fiber and then switched into different fibers/waveguides by a 1×N optical switch. The exiting ends of the waveguides form a 2D array which is placed in the focal plane (X'O'Y') of a lens. Each fiber with a coordinate of ($d_x$, $d_y$) emits a light signal whenever the switch turns on the waveguide, which is collimated by the lens and directed into a unique direction in the space. The location (the distance and angular direction) of an object can be denoted as P (r, θ, φ) as shown in FIG. 1(b), where r is the distance between the object and the lens center, which can be measured with either the ToF or FMCW technique. The sensing beam direction angles θ and φ which are defined as the vertical and horizontal beam angles from the YOZ and XOZ planes, respectively, as shown in FIG. 1(b), can be obtained from the position of the corresponding waveguide/fiber array element as:

$$\theta = \tan^{-1}\left(\frac{-d_x}{f}\right) \quad (1\text{-}a)$$

$$\varphi = \tan^{-1}\left(\frac{-d_y}{f}\right) \quad (1\text{-}b)$$

where $d_x$ and $d_y$ are the position coordinates of the fiber array element on the focal plane (X'O'Y') measured from the optical axis of the lens and f is the focal length of the lens. As can be seen, the further the fiber is from the optical axis of the lens, the larger the beam angle, and the smaller the focal length of the lens, the larger the beam angle. Taking the derivative of Eq. (1), one obtains the angular deviation of the beam with respect to a small change in $d_x$ or $d_y$ as:

$$\Delta\theta = \frac{-\Delta d_x/f}{1+d_x^2/f^2} \quad (2\text{-}a)$$

$$\Delta\varphi = \frac{-\Delta d_y/f}{1+d_y^2/f^2} \quad (2\text{-}b)$$

Accordingly, the angular deviation of the beam is linearly proportional to the small change in $\Delta d_x$ and $\Delta d_y$. In addition, the angular deviation of the beam is inversely proportional to the focal length when $d_x$ and $d_y$ are much less than f.

Assuming the field distribution at each waveguide/fiber exit is of a Gaussian shape, the waist diameter D of the corresponding collimated beam and its divergence angle δψ can be expressed as:

$$D + \frac{4\pi f}{\pi D_o} \quad (3)$$

$$\delta\psi = \frac{D_o}{f} \quad (4)$$

where $D_0$ is the beam diameter at the fiber/waveguide exit (or the mode field diameter) and λ is the wavelength. For a single mode fiber with a mode field diameter Do of 9 μm and lens with a focal length f of 20 mm, the diameter D and the divergence angle of the beam are about 4.4 mm and 0.026 degrees from Eqs. (3) and (4). For a silicon waveguide with a beam waist $D_0$ of 1 μm at the array exit, the diameter and the divergence angle of the collimated beams are 39.5 mm and $2.9\times10^{-3}$ degrees.

The angular resolution of the WDM beam array is determined by the spacing $\Delta d_x$ or $\Delta d_y$ between the adjacent fibers or waveguides using Eq. (2), which can be improved by reducing the fiber/waveguide spacing. However, the ultimate angular resolution may be limited by the beam divergence angle. Taking $\Delta\theta=\delta\psi$ and $\Delta\varphi=\delta\psi$, one obtains the smallest meaningful waveguide spacing $\Delta d_{min}$ from Eqs. (2) and (4) as:

$$\Delta d_{min} = D_0 \quad (5)$$

Taking the silicon waveguides with a spacing of $D_0=1$ μm and f=20 mm, the angular resolution of the beam array is $2.9\times10^{-3}$ degrees. Such a high beam quality is difficult to obtain with OPA, especially considering that OPA always has side lobes. In some implementations, the beam divergence angle may be on the order of 0.089 degrees.

The field of view (FOV) in the horizontal or the vertical directions are determined by the diameter of the lens or size of the array, whichever is smaller. In most cases, it is likely that the array size is the limitation because the size of lens can be made sufficiently large with relatively low cost. For example, for a lens with a focal length of 20 mm, an array with a width of 20 mm and a height of 5 mm, the FOV in the horizontal direction is 49.13 degrees and vertical direction is 13.275 degrees. Taking the fiber spacing of 0.125 mm for the above fiber array, the array size is 160×40, with an angular beam resolution of 0.36 degrees.

Another method to improve the beam angular resolution is to increase the focal length of the lens at the expense of reducing FOV from Eqs. (1) and (2). A lens with fast-variable focal length, such as a liquid lens, may also be used in the system to zoom in or out a target with adjustable angular resolution and FOV.

FIG. 2 shows an example of a 1$^{st}$ embodiment of 1D beam scan scheme enabled by waveguide-switching on a photonic integrated circuit (PIC) and position-to-angle conversion of a lens. A 1D waveguide array of different optical waveguides is used for achieving 1D beam scan. A 1×N optical switch switches light into each waveguide sequentially so that the lens can collimate the light from an individual waveguide into a collimated beam and direct the collimated beam into an output beam direction according to the relative position of the waveguide with respect to the optical axis of the lens following Eq. (1a). The optical switch can be made in various configurations, including a Mach-Zehnder configuration, micro-ring resonator configuration, or other suitable optical switch configurations. As illustrated, an optional bi-directional SOA may be placed in each waveguide to amplify the outgoing light and received light coupled back from the lens.

In various applications, 1D scan is not sufficient and 2D beam scan is desirable. FIG. 3 shows an example of a $2^{nd}$ embodiment of a 2D beam scan scheme enabled by waveguide-switching and position-to-angle conversion of a lens. Multiple 1D waveguide array PIC chips are stacked together to form a 2D array for achieving 2D beam scans. Each ID waveguide array may be configured in a way similar to what is shown in FIG. 2. In each design, the output ports or facets of the waveguides in the different 1D waveguide array form a 2D array and the lens is placed away at a distance equal or near the focal length of the lens so that each beam from a waveguide is directed to a unique direction by the lens corresponding to the unique position of the output port or facet of the waveguide at or near the focal plane of the lens.

In various implementations, stacking many chips together may pose manufacturing complications and a single chip capable of 2D beam scanning is desirable.

FIG. 4 shows an example of a $3^{rd}$ embodiment of a 2D beam scan scheme enabled by waveguide-switching on a single PIC chip and position-to-angle conversion of a lens. In this design, an array of N optical waveguides is provided to receive light from the 1×N optical switch. In each optical waveguide, different vertical grating couplers (VGC) are placed at designated different locations along the optical waveguide and different optical switches corresponding to the different VGCs are coupled at different locations in the optical waveguide to couple light out of the waveguide to direct to their corresponding VGCs so that the light is directed by the different VGCs out as an output beams in different directions (out of the waveguide plane in which the different optical waveguides are in). The different optical switches coupled to each waveguide can be 1×2 switches and are used to direct the light in different waveguides ($WG_n$) to their corresponding VGCs sequentially. The 1D waveguide and 2D VGC array can be placed on a single substrate and positioned in the focal plane of a lens to convert light from each VGC to a beam with a unique direction. As illustrated, an optional bi-directional SOA may be placed in each waveguide to amplify the outgoing light and received light coupled back from the lens. Some examples of VGCs can be found in P. M. J. Heck, "Highly integrated optical phased arrays: photonic integrated circuits for optical beam shaping and beam steering," Nanophotonics 6 (1), 93-107 (2017), which is incorporated by reference as part of the disclosure of this patent document.

In operation, beam scanning is realized by switching light into different waveguides in the 1D waveguide array sequentially via the 1×N switch and then, in each waveguide, by further operating the different 1×2 optical switches in the waveguide by switching the light to different $VGC_{ij}$ sequentially. The beam angles are determined by Eq. (1a) and Eq. (1b). In particular, the 1×N switch first directs the light into waveguide i before the 1×2 switches $SW_{i1}$ to $SW_{iN}$ along the waveguide turns on and off sequentially to complete row i scan. The 1×N switch then switches the light into another waveguide j before the switches $SW_{j1}$ to $SW_{jN}$ along the waveguide turn on and off sequentially to complete row j scan. Repeat the process above to complete N row beam scans. An optional bi-directional SOA ($SOA_i$) may be placed in each waveguide to amplify light going into and received from the VGC's. A control circuit can be used to couple to the 1×N switch and the different 1×2 switches to control those switches for the above beam scanning.

VGC's are generally wavelength sensitive and may be more involved to fabricate. A simpler approach may be to etch vertical reflectors at the end a waveguide to direct the light out of the PIC substrate plane. FIG. 5 shows an example of a $4^{th}$ embodiment of a 2D beam scan based on waveguide-switching on a PIC chip and position-to-angle conversion of a lens. This design uses a 1D array of different optical waveguides and a 2D array of different pairs of 1×2 switches and vertical reflectors (VR) coupled to the optical waveguides to achieve a 2D beam switching and scanning. Each 1×2 switch is coupled to a waveguide to either maintain the light in the waveguide or direct the light out of the waveguide to a corresponding VR which further directs received light out of the plane of the waveguides and VRs. As shown in two different examples of the VR design in FIGS. 5(b) and (c), each VR includes a VR waveguide and a slanted reflector facet etched on the end of the waveguide to couple light out of the substrate plane vertically or near-vertically either from front or back of the substrate. The multiple 1×2 switches are used to direct the light to each VR sequentially. Beam scan is realized by switching light into each waveguide i and then switching to each $VR_{ij}$ sequentially, where i is the index number for waveguide i and j is the index number for 1×2 switch j along the waveguide. Similar to FIG. 4, an optional bi-directional SOA ($SOA_i$) may be placed in each waveguide i to amplify light going into and received from the VRs.

In the 2D beam scanning designs in FIGS. 4 and 5, a lens is placed above substrate which supports the 1D waveguide array and 2D VRs or VGCs so that the focal plane of the lens is at or near the plane of the substrate. FIG. 6 shows an example of the lens placement in the example in FIG. 5 where the lens is placed at the back of the substrate for the configuration shown in FIG. 5b to direct light from each switch to a different direction and therefore enable a 2D beam scan when the switches are sequentially turned on. The beam angles are determined by Eq. (1a) and Eq. (1b). Similarly, a lens can also put on the front of the substrate for the configuration shown in FIG. 5c to enable 2D beam scan when corresponding switches are turned on sequentially.

A light detection and ranging (LiDAR) system or device scans probe light (e.g., laser light) to illuminate a target region and detects the returned probe light from the target region for sensing objects present in the target region and measuring a distance to each detected object. Many LiDARs are operated by sending out a pulsed laser beam and measuring reflected pulsed light. The distance of an object can be determined by measuring the time of flight (TOF) of a light pulse between the LiDAR and an object. A LiDAR can be configured based on a beam scanner using the disclosed combination of waveguide switching and position to angle conversion of a lens. In such a LiDAR, the ranging function can be performed with either the ToF, coherent, or microwave photonic FMCW technique. Several examples of such LiDARs are disclosed below.

FIG. 7 illustrates an example of a $1^{st}$ embodiment of a ToF Lidar based on 1D beam scan scheme enabled by waveguide-switching on a PIC chip and position-to-angle conversion of a lens in which a 1D waveguide array is used for achieving 1D beam scan as shown in FIG. 2. A laser, such as a DFB laser, can be used to generate the probe laser light and an optical modulator can be used to modulate the probe laser light as pulsed light for LiDAR operations. In some implementations, a semiconductor optical amplifier (SOA) may be used both as an optical modulator and an optical amplifier. In some designs, a laser that directly generates pulsed laser may also be used as the light source without a separate optical modulator. A 1×N optical switch is coupled to receive the pulsed laser light and switches the received light into N different light paths formed different optical waveguides sequentially in time. The output light from the different optical waveguides are then optically coupled to a lens so that the lens can collimate the light into a beam and direct the collimated beam into a particular beam direction according to the relative position of the corresponding optical waveguide with respect to the optical axis of the lens following Eq. (1a). The reflection of each beam from each individual optical waveguide from an object can be focused back into the corresponding waveguide which originates the beam and then is further directed into an optical detector, e.g., a photodetector (PD), to determine the distance of the reflection from the time delay of the returned pulse. An optical coupler or optical circulator can be placed between the light source/optical modulator and the optical switch to route the returned light to the photodetector.

To enable 3D sensing, a 2D beam scan is required. FIG. 8 illustrates an example of a $2^{nd}$ embodiment of a ToF Lidar based on waveguide-switching and position-to-angle conversion of a lens. Multiple 1D waveguide array PIC chips of FIG. 7 are stacked together to form a 2D array for achieving 2D beam scanning as shown in FIG. 3.

As a simpler alternative of stacking multiple 1D chips together as in FIG. 8 for 3D sensing, one may use the 2D beam scan scheme of FIG. 4 enabled by a single PIC chip. FIG. 9 illustrates of a $3^{rd}$ embodiment of a ToF Lidar based on waveguide-switching on a PIC chip and position-to-angle conversion of a lens based on the 2D beam scanning shown in FIG. 4. As explained in the text for FIG. 4, different vertical grating couplers (VGC) are used to couple light out of the waveguide plane of the N different optical waveguides and multiple 1×2 optical switches are used to direct the light to each VGC sequentially. Beam scan is realized by switching light into each waveguide i and then switching to each $VGC_{ij}$ sequentially. More specifically, the 1×N switch first directs the light into a waveguide i before the 1×2 switches $SW_{i1}$ to $SW_{iN}$ along the waveguide turns on and off sequentially to complete row i scan. The 1×N switch then switches the light into another waveguide j before the switches $SW_{j1}$ to $SW_{jN}$ along the waveguide turns on and off sequentially to complete another row j scan. Repeat the process above to complete N row beam scans. Finally, the PIC chip is placed in the focal plane of a lens to collimate the light emitted from each VGC into a beam and direct it to a unique direction. An optional bi-directional SOA ($SOA_i$) may be placed in each waveguide to amplify light going into and received from the VGC's.

The echo signal of each beam emitted by each individual $VGC_{ij}$ and reflected from an object is focused back into the corresponding $VGC_{ij}$ which originates the beam and eventually back to waveguide $WG_i$ before it is further directed into an optical detector, e.g., a photodetector (PD), to determine the distance of the reflection from the time delay of the returned pulse. An optical coupler or optical circulator can be placed between the light source/optical modulator and the optical switch to route the returned light to the photodetector.

FIG. 10 illustrates an example of a $4^{th}$ embodiment of a ToF Lidar based on waveguide-switching on a PIC chip and position-to-angle conversion of a lens as shown in FIG. 5. Here, vertical reflectors (VR) are used to replace the vertical grating couplers (VGC). The vertical reflectors (VR) are etched on the end of the waveguide to couple light out of the substrate plane vertically either from front or back of the substrate and multiple 1×2 switches are used to direct the light to each VR sequentially. The PIC chip is placed on the focal plane of a lens. Beam scan is realized by switching light into each waveguide and then switching to each $VR_{ij}$ sequentially. Like in FIG. 9, the 1×N switch first directs the light into a waveguide i before each of the 1×2 switches $SW_{i1}$ to $SW_{iN}$ along the waveguide turns on and off sequentially to complete row i scan. The 1×N switch then switches the light into another waveguide j before the switches $SW_{j1}$ to $SW_{jN}$ along the waveguide turns on and off sequentially to complete another row j scan. Repeat the process above to complete N row beam scans. An optional bi-directional SOA ($SOA_i$) may be placed in each waveguide to amplify light going into and received from the VR's.

The echo signal of each beam emitted by each individual $VR_{ij}$ and reflected from an object is focused back into the corresponding $VR_{ij}$ which originates the beam and eventually back to waveguide $WG_i$ before it is further directed into an optical detector, e.g., a photodetector (PD), to determine the distance of the reflection from the time delay of the returned pulse. An optical coupler or optical circulator can be placed between the light source/optical modulator and the optical switch to route the returned light to the photodetector.

The beam scanning schemes described in FIGS. 2-5 can also work for other ranging techniques, such as that based on coherence detection. FIG. 11 shows an example of a coherent Lidar implementation based on 1D beam scan scheme enabled by waveguide-switching on a PIC chip and position-to-angle conversion of a lens in which a 1D waveguide array is used for achieving 1D beam scan shown in FIG. 2. In the figure, TL stands for a tunable laser, C1 is an optical coupler with a coupling ratio around 1%, C2 is a second coupler with a coupling ratio around 50%, C3 is a thirds optical coupler with a coupling ratio around 50%. A balanced detector module with two photodetectors PD1 and PD2 and optical couplers C1, C2 and C3 are provided to form an optical interferometer so that a portion of light from the tunable laser source and the returned light received by the LiDAR from the target to optically interfere at the optical coupler C3 for optical detection. The received interferometric signal in the balanced detector then can be converted to digital signals from an analog-to-digital converter (ADC) before being Fourier transformed to obtain the distance information of the reflections from the targets. FIG. 12 shows an example of a coherent LiDAR implementation based on waveguide-switching and position-to-angle conversion of a lens to achieve 2D beam scanning shown in FIG. 3. Multiple 1D waveguide PIC array are stacked together to form a 2D array for achieving 2D beam scans. Again, TL stands for a tunable laser, and C1, C2, and C3 are optical couplers with coupling ratios around 1%, 50%, and 50%, respectively. Similar to FIG. 11, on each chip the reflected light from a target is coupled out by C2 to interfere at coupler C3 with the reference light directly from the tunable laser coupled out by C1. A balanced detector with two photodetectors PD1 and PD2 receives the interference signal and send to an ADC to be digitized. Finally, fast Fourier transform (FFT) is performed with the digital data for obtaining the distance information of the reflections from the targets. Data from all the 1D chips can be combined by a computer or digital signal processor (DSP) to generate the point-cloud map.

FIG. 13 shows an example of a coherent LidAR implementation based on waveguide-switching on a PIC chip and position-to-angle conversion of a lens shown in FIG. 4. The vertical grating couplers (VGC) are used to couple light out of the waveguide plane and multiple 1×2 switches are used to direct the light to each VGC sequentially. Beam scan is realized by switching light into each waveguide and then switching to each $VGC_{ij}$ sequentially. More specifically, the 1×N switch first directs the light into a waveguide i before each of the 1×2 switches $SW_{i1}$ to $SW_{iN}$ along the waveguide turns on and off sequentially to complete row i scan. The 1×N switch then switches the light into another waveguide j before each of the switches $SW_{j1}$ to $SW_{jN}$ along the waveguide turns on and off sequentially to complete another row j scan. Repeat the process above to complete N row beam scans. An optional bi-directional SOA ($SOA_i$) may be placed in each waveguide to amplify light going into and received from the VR's.

In FIG. 13, TL stands for a tunable laser, and C1, C2, and C3 are optical couplers with coupling ratios around 1%, 50%, and 50%, respectively. An optional bi-directional SOA ($SOA_i$) may be placed in each waveguide to amplify light going into and received from the VGC's.

Similar to FIG. 11, the reflected light from a target is coupled out by C2 to interfere at coupler C3 with the reference light directly from the tunable laser coupled out by C1. A balanced detector with two photodetectors PD1 and PD2 receives the interference signal and send to an ADC to be digitized. Finally, fast Fourier transform is performed with the digital data for obtaining the distance information of the reflections from the targets.

FIG. 14 shows an example of a coherent Lidar implementation based on waveguide-switching on a single PIC chip and position-to-angle conversion of a lens for 2D beam scanning shown in FIG. 5. The vertical reflectors (VR) are etched on the end of the waveguide to couple light out of the substrate plane vertically either from front or back of the substrate and multiple 1×2 switches are used to direct the light to each VR sequentially. Beam scan is realized by switching light into each waveguide and then switching to each $VR_{ij}$ sequentially. An optional bi-directional SOA ($SOA_i$) may be placed in each waveguide to amplify light going into and received from the VGC's. Here except the vertical reflectors are used to replace the vertical grating couplers, the beam scan and ranging operations of FIG. 14 are the same as those of FIG. 13.

Microwave photonic techniques can also be used to perform the ranging function of a LiDAR. FIG. 15 shows an example of a microwave photonic FWCW LiDAR implementation based on 1D beam scanning shown in FIG. 2 enabled by waveguide-switching on a PIC chip and position-to-angle conversion of a lens in which a 1D waveguide array is used for achieving 1D beam scan. A local oscillator LO with linearly tuned frequency is provided to apply a modulation signal to the optical modulator for modulating the laser light and to apply the LO signal to a signal mixer. The mixer receives and mixes the LO signal and the photodetector signal generated by the photodetector from detecting returned light from the LiDAR to perform LiDAR signal processing. In particular, the output signal from the mixer is filtered by a low-pass filter to remove the high-frequency components and then digitized to obtain the distance information of reflections by taking the FFT of the digitized signal.

FIG. 16 shows an example of a microwave photonic FWCW Lidar implementation based on stacked 1D waveguide-switching and position-to-angle conversion of a lens for 2D beam scanning shown in FIG. 3. Multiple 1D waveguide PIC chips are stacked together to form a 2D array for achieving 2D beam scans. The signal detection and processing of each chip are the same as those of FIG. 15. Data from all the 1D chips can be combined by a computer or digital signal processor (DSP) to generate the point-cloud map.

FIG. 17 shows an example of a microwave photonic FWCW Lidar implementation based on 2D waveguide-switching on a PIC chip and position-to-angle conversion of a lens shown in FIG. 4. As described in FIG. 4, the vertical grating couplers (VGC) are used to couple light out of the waveguide plane and multiple 1×2 switches are used to direct the light to each VGC sequentially. Beam scan is realized by switching light into each waveguide and then switching to each $VGC_{ij}$ sequentially. An optional bi-directional SOA ($SOA_i$) may be placed in each waveguide to amplify light going into and received from the VGC's.

Similar to FIG. 15, a local oscillator LO with linearly tuned frequency is provided to apply a modulation signal to the optical modulator for modulating the laser light and to apply the LO signal to a signal mixer at the same signal frequency. The mixer receives and mixes the LO signal and the photodetector signal generated by the photodetector from detecting returned light from the LiDAR to perform LiDAR signal processing. In particular, the output signal from the mixer is filtered by a low-pass filter to remove the high-frequency components and then digitized to obtain the distance information of reflections by taking the FFT of the digitized signal.

FIG. 18 shows an example of a microwave photonic FMCW Lidar implementation based on 2D waveguide-switching on a PIC chip and position-to-angle conversion of a lens shown in FIG. 5. As described in FIG. 5, the vertical reflectors (VR) are etched on the end of the waveguide to couple light out of the substrate plane vertically either from front or back of the substrate and multiple 1×2 switches are used to direct the light to each VR sequentially. Beam scan is realized by switching light into each waveguide and then switching to each $VR_{ij}$ sequentially. An optional bi-directional SOA ($SOA_i$) may be placed in each waveguide to amplify light going into and received from the VGC's. The only difference between FIG. 18 and FIG. 17 is that the vertical reflectors (VR's) are used to replace the vertical grating couplers (VGC's). All the signal processing remain the same.

The 1×N switch in FIG. 2-5 can be replaced by a WDM of N wavelength channels and a step-tunable lasers with at least N wavelength output. FIG. 19 shows an example of an implementation of a wavelength-stepping ToF Lidar based on 1D beam scanning similar to FIG. 2, enabled by waveguide-switching on a PIC chip and position-to-angle conversion of a lens in which a 1D waveguide array is used for achieving 1D beam scan. Instead of using the 1×N switch as in FIG. 2, here waveguide switching is enabled by scanning or stepping the optical wavelength of the laser by using a wavelength-stepping laser (WSL) to produce laser light at different laser wavelengths to an optical modulator which is driven by a system clock signal to perform the optical modulation. The optical modulator can be in various configurations, including a Mach Zehnder modulator (MZM) or an electro-absorption modulator, or simply using an SOA as both the modulator and amplifier. A wavelength division multiplexer/demultiplxer (WDM) is used to couple light between the optical circulator or optical coupler and multiple optical waveguides.

For the beam scan operation, the laser is first tuned to generate a light of wavelength $\lambda_1$, which is then directed by the WDM to waveguide 1 ($WG_1$) to be further collimated by the lens and sent to a unique direction according to the position of the $WG_1$ with respect to the optical axis of the lens following Eq. (1a). The laser is next tuned to a second wavelength $\lambda_2$, which is then directed by the WDM to waveguide 2 ($WG_2$) to be further collimated by the lens and sent to a second direction according to the position of the $WG_2$ with respect to the optical axis of the lens following Eq. (1a). By tuning the laser wavelengths, the laser light can be switched to different waveguides ($WG_1$ to $WG_N$) sequentially, to enable beam scan via the lens.

The echo of each beam emitted from each individual optical waveguide and reflected from an object is focused back into the corresponding waveguide which originates the beam and then is further directed into an optical detector, e.g., a photodetector (PD), to determine the distance of the reflection from the time delay of the returned pulse. An optical coupler or optical circulator can be placed between the light source/optical modulator and the optical switch to route the returned light to the photodetector.

FIG. 20 shows an example of an implementation of a wavelength-stepping ToF Lidar based on 1D stacked waveguide-switching and position-to-angle conversion of a lens similar to FIG. 3. Multiple 1D waveguide PIC chips (M chips) in FIG. 19 are stacked together to form a 2D array for achieving 2D beam scans. All the 1D PIC chips can be synchronized to generate a line scan of M beams or can be scanned independently, which enable the LiDAR system to focus the beams around a target of interest. In FIG. 20, WSL is the wavelength-stepping laser and the modulator can be MZM or an electro-absorption modulator, or simply using an SOA as both the modulator and amplifier. The signal detection and processing of each chip are the same as those of FIG. 19. Data from all the 1D chips can be combined by a computer or digital signal processor (DSP) to generate the point-cloud map.

FIG. 21 shows an example of an implementation of a wavelength-stepping ToF Lidar based on waveguide-switching on a PIC chip and position-to-angle conversion of a lens. similar to FIG. 4. Different from the system in FIG. 4, here the 1×N switch is replaced by a WDM and the laser is replaced with a wavelength-stepping laser (WSL). Waveguide switching is enabled by tuning or stepping the laser wavelength. The vertical grating couplers (VGC) are used to couple light out of the waveguide plane and multiple 1×2 switches are used to direct the light to each VGC sequentially. Beam scan is realized by first stepping the WSL to wavelength i so that the WDM can direct the light into waveguide $WG_i$, which is then switched to each $VGC_{ij}$ sequentially. In FIG. 21, WSL is the wavelength-stepping laser and the modulator can be MZM or an electro-absorption modulator, or simply using an SOA as both the modulator and amplifier. An optional bi-directional SOA ($SOA_i$) may be placed in each waveguide to amplify light going into and received from the VGC's.

For the beam scan operation, the laser is first tuned to generate a light of wavelength Xi, which is then directed by the WDM to waveguide 1 ($WG_1$). The M 1×2 switches connected to $WG_1$ are then turned on and off sequentially to send light of $\lambda_1$ to each $VGC_{1j}$ (j=1 to M) to be further collimated by the lens and sent to a unique direction according to the position of the $VGC_{1j}$ with respect to the optical axis of the lens following Eq. (1a). The laser is next tuned to a second wavelength $\lambda_2$, which is then directed by the WDM to waveguide 2 ($WG_2$). The M 1×2 switches connected to $WG_2$ are then turned on and off sequentially to send light of $\lambda_2$ to each $VGC_{2j}$ (j=1 to M) to be further collimated by the lens and sent to a second direction according to the position of the $VGC_{2j}$ with respect to the optical axis of the lens following Eq. (1a). Repeat the process above by stepping through the laser wavelengths from 1 to N and then turn the 1×2 switches on and off sequentially, the laser light can be switched to different waveguides ($WG_1$ to $WG_N$) and further to different $VGC_{ij}$ (i=1 to N and j=1 to M) sequentially, to enable beam scan via the lens.

The echo signal of each beam emitted by each individual $VGC_{ij}$ and reflected from an object is focused back into the corresponding $VGC_{ij}$ which originates the beam and eventually back to waveguide $WG_i$ before it is further directed into an optical detector, e.g., a photodetector (PD), to determine the distance of the reflection from the time delay of the returned pulse. An optical coupler or optical circulator can be placed between the light source/optical modulator and the optical switch to route the returned light to the photodetector.

FIG. 22 shows an example of a implementation of a wavelength-stepping ToF Lidar based on 2D waveguide-switching on a PIC chip and position-to-angle conversion of a lens similar to FIG. 5. The only difference between FIG. 22 and FIG. 21 is that here vertical reflectors (VR) are used to replace vertical grating couplers (VGC). In particular, the VR's are etched on the end of the waveguides connected to the 1×2 switches to couple light out of the substrate plane vertically either from front or back of the substrate and multiple 1×2 switches are used to direct the light to each VR sequentially. Beam scan is realized by switching light into each waveguide by stepping the wavelength of the WSL and then switching to each $VR_{ij}$ sequentially. In FIG. 22, WSL is the wavelength-stepping laser and the modulator can be MZM or an electro-absorption modulator, or simply using an SOA as both the modulator and amplifier. An optional bi-directional SOA ($SOA_i$) may be placed in each waveguide to amplify light going into and received from the VGC's.

For the beam scan operation, the laser is first tuned to generate a light of wavelength $\lambda_1$, which is then directed by the WDM to waveguide 1 ($WG_1$). The M 1×2 switches connected to $WG_1$ are then turned on and off sequentially to send light of $\lambda_1$ to each $VR_{ij}$ (j=1 to M) to be further collimated by the lens and sent to a unique direction according to the position of the $VR_{1j}$ with respect to the optical axis of the lens following Eq. (1a) and Eq. (1b). The laser is next tuned to a second wavelength $\lambda_2$, which is then directed by the WDM to waveguide 2 ($WG_2$). The M 1×2 switches connected to $WG_2$ are then turned on and off sequentially to send light of $\lambda_2$ to each $VR_{2j}$ (j=1 to M) to be further collimated by the lens and sent to a second direction according to the position of the $VR_{2j}$ with respect to the optical axis of the lens following Eq. (1a) and Eq. (1b). Repeat the process above by stepping through the laser wavelengths from 1 to N and then turn the 1×2 switches on and off sequentially, the laser light can be switched to different waveguides ($WG_1$ to $WG_N$) and to different $VR_{ij}$ (i=1 to N and j=1 to M) sequentially, to enable beam scan via the lens.

The echo signal of each beam emitted by each individual $VR_{ij}$ and reflected from an object is focused back into the corresponding $VR_{ij}$ which originates the beam and eventually back to waveguide $WG_i$ before it is further directed into an optical detector, e.g., a photodetector (PD), to determine the distance of the reflection from the time delay of the returned pulse. An optical coupler or optical circulator can be placed between the light source/optical modulator and the optical switch to route the returned light to the photodetector.

FIG. 23a shows an example of a multi-wavelength ToF Lidar based on the combination of WDM, waveguide-switching on a PIC chip, and position-to-angle conversion of a lens. A multi-wavelength laser (MWL) with N different wavelengths is modulated and amplified before being demultiplexed by WDM1 into N waveguides, with the ith waveguide receives wavelength $\lambda_i$. There are M 1×2 switches along each waveguide i (i=1 . . . N) to switch light out to vertical grating couplers ($VGC_{ij}$, j=1 . . . M) for coupling light out of the waveguide plane sequentially. The VGC's on each waveguide i are designed for the corresponding wavelength $\lambda_i$. All the VGC's form an emitter plane and are placed in the focal plane of a lens to collimate them into different directions. Multiple beams can be scanned simultaneously by simultaneously turning the jth (j=1 . . . M) switch on all N waveguides sequentially. For example, all the $1^{st}$ 1×2 switches on each of the N waveguides are first turned on and off together, then all the $2^{nd}$ 1×2 switches on each of N waveguides are turned on and off together, and all the jth 1×2 switches on each of N waveguides are turned on and off together, till all the Mth 1×2 switches on each of N waveguides are turned on and off together to complete a beam scan cycle. A line scan of N optical beams can be realized. Alternatively, the 1×2 switches on each waveguide i can be switched independently from those on other waveguide j to form flexible beam scan patterns. The LiDAR system can be programmed such that, when an object is detected, multiple beams around the objected can be given more time to track the object more closely.

The echo signal of each beam with a wavelength $\lambda_i$ emitted by each individual $VGC_{ij}$ and reflected from an object is focused back into the corresponding $VGC_{ij}$ which originates the beam and eventually back to waveguide $WG_i$ before it is received by WDM1. It is further directed by WDM1 to WDM2 via a circulator or a coupler, and finally reaches PDi to determine the distance of the reflection from the time delay of the returned pulse. All together, N photodetectors ($PD_1$ to $PD_N$) are used to detect N echo signals of N wavelengths simultaneously.

In FIG. 23, the modulator can be of MZM or an electro-absorption modulator, or simply using an SOA as both the modulator and amplifier. The multi-wavelength length source (MWL) can be generated by combining multiple DFB lasers with a wavelength division multiplexers, a on-chip mode-locked laser, or a frequency comb made with Kerr microresonators. FIG. 23b illustrates placing the PIC chip in the focal plane of a lens to collimate the light from each VGC into a beam and to direct the beam into a unique direction determined by the relative position of the VGC with respect to the optical axis of the lens. By switching light into different VGC sequentially, beam scan is enabled. An optional bi-directional SOA ($SOA_i$) may be placed in each waveguide to amplify light going into and received from the VGC's.

FIG. 24 shows another example of a multi-wavelength ToF Lidar based on the combination of WDM, waveguide-switching on a PIC chip and position-to-angle conversion of a lens. The only difference between FIG. 24 and FIG. 23 is that here vertical reflectors (VR) are used to replace vertical grating couplers (VGC) in FIG. 23. Similar to FIG. 23, a multi-wavelength laser (MWL) with N different wavelengths is modulated and amplified before being demultiplexed by WDM1 into N waveguides, with the ith waveguide receives wavelength $\lambda_i$. There are M 1×2 switches along each waveguide i (i=1 . . . N) to switch light out to vertical gratings ($VR_{ij}$, j=1 . . . M) for coupling light out of the waveguide plane sequentially. The VR's on each waveguide i are designed for the corresponding wavelength $\lambda_i$. All the VR's form an emitter plane and are placed in the focal plane of a lens to collimate them into different directions. Multiple beams can be scanned simultaneously by simultaneously turning the jth (j=1 . . . M) switch on all N waveguides sequentially. For example, all the $1^{st}$ 1×2 switches on each of the N waveguides are first turned on and off together, then all the $2^{nd}$ 1×2 switches on each of N waveguides are turned on and off together, and all the jth 1×2 switches on each of N waveguides are turned on and off together, till all the Mth 1×2 switches on each of N waveguides are turned on and off together to complete a beam scan cycle. A line scan of N optical beams can be realized. Alternatively, the 1×2 switches on each waveguide i can be switched independently from those on other waveguide j to form flexible beam scan patterns. The LiDAR system can be programmed such that, when an object is detected, multiple beams around the objected can be given more time to track the object more closely.

The echo signal of each beam with a wavelength $\lambda_i$ emitted by each individual $VR_{ij}$ and reflected from an object is focused back into the corresponding $VR_{ij}$ which originates the beam and eventually back to waveguide $WG_i$ before it is received by WDM1. It is further directed by WDM1 to WDM2 via a circulator or a coupler, and finally reaches PDi to determine the distance of the reflection from the time delay of the returned pulse. All together, N photodetectors ($PD_1$ to $PD_N$) are used to detect N echo signals from N wavelengths simultaneously and respectively.

In FIG. 24, MWL is the multi-wavelength laser, the modulator can be MZM or an electro-absorption modulator, or simply using an SOA as both the modulator and amplifier. An optional bi-directional SOA ($SOA_i$) may be placed in each waveguide to amplify light going into and received from the VGC's. In comparison with the 2D beam scan configurations in FIGS. 3-5, which rely on switches, the configuration in this design using combined WDM and 1×2 switches can significantly reduce the number of switches used. For example, the 1×N switch in FIG. 4 contains 1 1×2 switch and (N−2) 2×2 switches if made with planar waveguide technology. If 32 waveguides are used (N=32), each waveguide contains 32 switches, the total number of switches are 31×32×32=31744. If a 32-channel WDM is used to replace the 1×N switch, the total number of switches can be reduced to 1024. It is possible that the N different wavelength channels are for the vertical field of view and the M 1×2 switches on each wavelength channel are for the horizontal field of view.

As shown by the examples above, the combination of waveguide-switching and WDM beam scan can be advantageously used for various applications While this patent document contains many specifics, these should not be construed as limitations on the scope of any subject matter or of what may be claimed, but rather as descriptions of features that may be specific to particular embodiments of particular techniques. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Only a few implementations and examples are described and other implementations, enhancements and variations can be made based on what is described and illustrated in this patent document.

What is claimed is what is described and/or illustrated, including:

1. A system comprising an optical beam scanning device which further comprises:
   a substrate
   an array of optical waveguides supported by the substrate and spaced from one another at different positions;
   a first optical switch supported by the substrate and located to direct an optical beam to the array of the optical waveguides and operable to, in response to a control signal, direct the optical beam to one of the optical waveguides at a time to sequentially direct the optical beam to the optical waveguides;
   optical couplers formed at different locations adjacent to the optical waveguides so that each optical waveguide is designated with, and corresponds to, a plurality of optical couplers along the each optical waveguide, each optical coupler structured to receive light from a corresponding optical waveguide and to direct the received light out of a plane of the substrate;
   second optical switches formed at different locations adjacent to the optical waveguides so that each optical waveguide is designated with, corresponds to, a plurality of second optical switches along the each optical waveguide, wherein each second optical switch is coupled to a designated optical waveguide to either direct light out of the designated optical waveguide or to maintain the light in the designated optical waveguide, and each second optical switch is located and paired to a designated optical coupler and structured to couple light from a corresponding designated optical waveguide to the paired designated optical coupler which directs light from the each second optical switch out of the plane of the substrate as an optical output beam; and
   a lens spaced from substrate by a distance equal to or near a focal length of the lens to receive the optical output beam from the optical couplers to direct the optical output beam from each optical coupler to a unique beam direction based on a position of the optical relative to the lens so that the optical output beam directed from different optical couplers is directed by the lens to different directions by the lens.

2. The system as in claim 1, wherein the optical beam scanning device further includes:
   a control circuit coupled to control the first optical switch and the second optical switches to operate the first optical switch to sequentially direct the optical beam to the optical waveguides, one waveguide at time, and to operate the second optical switches designated to each optical waveguide to sequentially couple the optical beam out of the each optical waveguide to corresponding optical couplers designed to the each optical waveguide to direct the optical beam of the each optical waveguide to the lens from the corresponding optical couplers, sequentially, one optical coupler at a time.

3. The system as in claim 1, wherein:
   each optical coupler is a vertical grating coupler.

4. The system as in claim 1, wherein:
   each optical coupler is a vertical waveguide reflector.

5. The system as in claim 1, further comprising a light detection and ranging (LiDAR) device which is structured to comprise:
   a light source to produce an optical beam;
   the beam scanning device located in an optical path of the optical beam to direct and scan the optical beam to a surrounding area for LiDAR sensing and to receive returned light from the surrounding area illuminated by the optical beam;
   an optical circulator located in the optical path between the light source and the beam scanning device to direct the optical beam from the light source to the beam scanning device and to receive and direct the returned light received by the beam scanning device as a detected returned beam that is separate from the optical beam from the light source; and
   an optical detector coupled to receive the detected returned beam from the optical circulator and to produce a detector output signal for LiDAR sensing.

6. The system as in claim 5, wherein the optical beam scanning device further includes:
   a control circuit coupled to control the first optical switch and the second optical switches to operate the first optical switch to sequentially direct the optical beam to the optical waveguides, one waveguide at time, and to operate the second optical switches designated to each optical waveguide to sequentially couple the optical beam out of the each optical waveguide to corresponding optical couplers designed to the each optical waveguide to direct the optical beam of the each optical waveguide to the lens from the corresponding optical couplers, sequentially, one optical coupler at a time.

7. The system as in claim 5, wherein:
   each optical coupler is a vertical grating coupler.

8. The system as in claim 5 wherein:
   each optical coupler is a vertical waveguide reflector.

9. A light detection and ranging (LiDAR) device, comprising:
   a light source to produce an optical beam that includes laser light at different laser wavelengths;
   a beam scanning device located in an optical path of the optical beam to direct and scan the optical beam to a surrounding area for LiDAR sensing and to receive returned light from the surrounding area illuminated by the optical beam;
   an optical circulator located in the optical path between the light source and the beam scanning device to direct the optical beam from the light source to the beam scanning device and to receive and direct the returned light received by the beam scanning device as a detected returned beam that is separate from the optical beam from the light source;
   a wavelength division multiplexing device to receive the detected returned beam from the optical circulator and to separate the detected returned beam into different detected optical beams at the different laser wavelengths;
   an optical detector array of photodetectors coupled to receive the different detected optical beams at the different laser wavelengths from the wavelength division multiplexing device, respectively, to produce different detector output signals from the different detected optical beams at the different laser wavelengths for LiDAR sensing, wherein the beam scanning device is structured to include:

a wavelength division demultiplexing device to receive the optical beam from the light source that includes laser light at the different laser wavelengths from the optical circulator and to separate the received optical beam into different optical beams at the different laser wavelengths, respectively;

an array of optical waveguides coupled to receive the different optical beams at the different laser wavelengths, respectively, from the wavelength division demultiplexing device;

optical couplers formed at different locations adjacent to the optical waveguides so that each optical waveguide is designated with, and corresponds to, a plurality of optical couplers along the each optical waveguide, each optical coupler structured to receive light from a corresponding optical waveguide and to direct the received light out of a plane of the substrate;

optical switches formed at different locations adjacent to the optical waveguides so that each optical waveguide is designated with, corresponds to, a plurality of optical switches along the each optical waveguide, wherein each optical switch is coupled to a designated optical waveguide to either direct light out of the designated optical waveguide or to maintain the light in the designated optical waveguide, and each optical switch is located and paired to a designated optical coupler and structured to couple light from a corresponding designated optical waveguide to the paired designated optical coupler which directs light from the each optical switch out of a plane of the optical waveguides as an optical output beam; and a lens spaced from the plane of the optical waveguides by a distance equal to or near a focal length of the lens to receive the optical output beam from the optical couplers to direct the optical output beam from each optical coupler to a unique beam direction based on a position of the optical relative to the lens so that the optical output beam directed from different optical couplers is directed by the lens to different directions by the lens.

10. The LiDAR device as in claim 9, comprising:
a control circuit coupled to control the optical switches to operate the optical switches designated to each optical waveguide to sequentially couple the optical beam out of the each optical waveguide to corresponding optical couplers designed to the each optical waveguide to direct the optical beam of the each optical waveguide to the lens from the corresponding optical couplers, sequentially, one optical coupler at a time.

11. The device as in claim 9, wherein:
each optical coupler is a vertical grating coupler.

12. The device as in claim 9, wherein:
each optical coupler is a vertical waveguide reflector.

* * * * *